United States Patent
Futatsuyama et al.

(10) Patent No.: US 11,120,883 B2
(45) Date of Patent: Sep. 14, 2021

(54) SEMICONDUCTOR STORAGE DEVICE

(71) Applicant: KIOXIA CORPORATION, Tokyo (JP)

(72) Inventors: Takuya Futatsuyama, Kanagawa (JP); Masanobu Shirakawa, Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/022,586

(22) Filed: Sep. 16, 2020

(65) Prior Publication Data

US 2020/0411118 A1    Dec. 31, 2020

Related U.S. Application Data

(62) Division of application No. 16/292,040, filed on Mar. 4, 2019, now Pat. No. 10,811,105.

(30) Foreign Application Priority Data

Jul. 18, 2018  (JP) .............................. JP2018-135193

(51) Int. Cl.
*G11C 11/34* (2006.01)
*G11C 16/26* (2006.01)
(Continued)

(52) U.S. Cl.
CPC .............. *G11C 16/26* (2013.01); *G11C 5/063* (2013.01); *G11C 11/5671* (2013.01);
(Continued)

(58) Field of Classification Search
CPC ......... G11C 16/26; G11C 5/063; G11C 16/08; G11C 16/30; G11C 16/34; G11C 11/5671;
(Continued)

(56) References Cited

U.S. PATENT DOCUMENTS

2010/0207195 A1* 8/2010 Fukuzumi ......... H01L 27/11578
                                                                  257/326
2012/0220088 A1* 8/2012 Alsmeier .......... H01L 27/11578
                                                                  438/261
(Continued)

FOREIGN PATENT DOCUMENTS

JP    2017-168163 A    9/2017

OTHER PUBLICATIONS

Lue et al. "A Novel Double-density, Single-Gate Vertical Channel (SGVC) 3D NANO Flash that is Tolerant to Deep Vertical Etching CD Variation and Possesses Robust Read-disturb Immunity," 2015 IEEE International Electron Devices Meeting, pp. 3.2.1-3.2.4, 2015.

*Primary Examiner* — Uyen Smet
(74) *Attorney, Agent, or Firm* — Kim & Stewart LLP

(57) ABSTRACT

A semiconductor storage device includes a first semiconductor extending above a substrate and including a first part and a second part, a first word line at a first level above the substrate and facing the first part of the first semiconductor, a second word line at the first level above the substrate and facing the second part of the first semiconductor, a first cell transistor including a first area of the first part of the first semiconductor that faces the first word line, and a second cell transistor including a second area of the second part of the first semiconductor that faces the second word line, wherein during an operation of reading data from the first cell transistor, a first voltage that is less than a threshold voltage of the second cell transistor and greater than or equal to zero voltage is applied to the second word line.

14 Claims, 37 Drawing Sheets

(51) Int. Cl.
*H01L 27/1157* (2017.01)
*H01L 27/11582* (2017.01)
*G11C 5/06* (2006.01)
*G11C 16/08* (2006.01)
*G11C 16/30* (2006.01)
*G11C 16/34* (2006.01)
*G11C 11/56* (2006.01)

(52) U.S. Cl.
CPC .............. *G11C 16/08* (2013.01); *G11C 16/30* (2013.01); *G11C 16/34* (2013.01); *H01L 27/1157* (2013.01); *H01L 27/11582* (2013.01)

(58) Field of Classification Search
CPC . G11C 11/5642; G11C 11/40; H01L 27/1157; H01L 27/11582; H01L 27/11565
See application file for complete search history.

(56) References Cited

U.S. PATENT DOCUMENTS

| | | | |
|---|---|---|---|
| 2014/0247660 A1 | 9/2014 | Avila et al. | |
| 2015/0221379 A1* | 8/2015 | Aritome | G11C 16/14 365/185.11 |
| 2016/0189770 A1* | 6/2016 | Abe | G11C 16/0483 365/185.03 |
| 2017/0271021 A1 | 9/2017 | Futatsuyama et al. | |
| 2018/0277565 A1 | 9/2018 | Futatsuyama et al. | |

* cited by examiner

FIG. 12

| | CBL1 (BL0) | CBL2 (BL1) | CBL3 (BL2) | CBL4 (BL3) | CBL5 (BL4) | CBL6 (BL5) | CBL7 (BL6) | CBL8 (BL7) | CBL9 (BL8) | ⋮ |
|---|---|---|---|---|---|---|---|---|---|---|
| SU2 | Pr | FREE | FREE | FREE | Pr | FREE | FREE | FREE | Pr | ⋮ |
| SU3 | FREE | FREE | FREE | FREE | FREE | FREE | FREE | FREE | FREE | ⋮ |
| SU4 | FREE | Pr | Pr | Pr | FREE | Pr | Pr | Pr | FREE | ⋮ |

FIG. 16

| | CBL1 (BL0) | CBL2 (BL1) | CBL3 (BL2) | CBL4 (BL3) | CBL5 (BL4) | CBL6 (BL5) | CBL7 (BL6) | CBL8 (BL7) | CBL9 (BL8) | ⋮ |
|---|---|---|---|---|---|---|---|---|---|---|
| SU2 | X0 | FREE | FREE | FREE | X4 | FREE | FREE | FREE | X8 | ⋮ |
| SU3 | X0 | X1 | X2 | X3 | X4 | X5 | X6 | X7 | X8 | ⋮ |
| SU4 | FREE | X1 | X2 | X3 | FREE | X5 | X6 | X7 | FREE | ⋮ |

FIG. 21

| | CBL1 (BL0) | CBL2 (BL1) | CBL3 (BL2) | CBL4 (BL3) | CBL5 (BL4) | CBL6 (BL5) | CBL7 (BL6) | CBL8 (BL7) | CBL9 (BL8) | ... |
|---|---|---|---|---|---|---|---|---|---|---|
| SU2 | Pr | FREE | FREE | FREE | Pr | FREE | FREE | FREE | Pr | ... |
| SU3 | X0 | X1 | X2 | X3 | X4 | X5 | X6 | X7 | X8 | ... |
| SU4 | Pr | Pr | Pr | Pr | Pr | Pr | Pr | Pr | Pr | ... |
| SU5 | X0 | X1 | X2 | X3 | X4 | X5 | X6 | X7 | X8 | ... |
| SU6 | FREE | Pr | Pr | Pr | FREE | Pr | Pr | Pr | FREE | ... |

FIG. 23

| | CBL1 (BL0) | CBL2 (BL1) | CBL3 (BL2) | CBL4 (BL3) | CBL5 (BL4) | CBL6 (BL5) | CBL7 (BL6) | CBL8 (BL7) | CBL9 (BL8) | ⋮ |
|---|---|---|---|---|---|---|---|---|---|---|
| SU2 | X0 | FREE | FREE | FREE | X4 | FREE | FREE | FREE | X8 | ⋮ |
| SU3 | X0 | X1 | X2 | X3 | X4 | X5 | X6 | X7 | X8 | ⋮ |
| SU4 | X0 | X1 | X2 | X3 | X4 | X5 | X6 | X7 | X8 | ⋮ |
| SU5 | X0 | X1 | X2 | X3 | X4 | X5 | X6 | X7 | X8 | ⋮ |
| SU6 | FREE | X1 | X2 | X3 | FREE | X5 | X6 | X7 | FREE | ⋮ |

FIG. 25

| | CBL1 (BL0) | CBL2 (BL1) | CBL3 (BL2) | CBL4 (BL3) | CBL5 (BL4) | CBL6 (BL5) | CBL7 (BL6) | CBL8 (BL7) | CBL9 (BL8) | ... |
|---|---|---|---|---|---|---|---|---|---|---|
| SU2 | Pr | FREE | FREE | FREE | Pr | FREE | FREE | FREE | Pr | ... |
| SU3 | X0 | X1 | X2 | X3 | X4 | X5 | X6 | X7 | X8 | ... |
| SU4 | X0 | X1 | X2 | X3 | X4 | X5 | X6 | X7 | X8 | ... |
| SU5 | Pr | FREE | FREE | FREE | Pr | FREE | FREE | FREE | Pr | ... |

FIG. 29

| | SU2 | SU3 | SU4 | SU5 |
|---|---|---|---|---|
| CBL1 (BL0) | X0 | X0 | X0 | X0 |
| CBL2 (BL1) | FREE | X1 | X1 | FREE |
| CBL3 (BL2) | FREE | X2 | X2 | FREE |
| CBL4 (BL3) | FREE | X3 | X3 | FREE |
| CBL5 (BL4) | X4 | X4 | X4 | X4 |
| CBL6 (BL5) | FREE | X5 | X5 | FREE |
| CBL7 (BL6) | FREE | X6 | X6 | FREE |
| CBL8 (BL7) | FREE | X7 | X7 | FREE |
| CBL9 (BL8) | X8 | X8 | X8 | X8 |
| ⋮ | ⋮ | ⋮ | ⋮ | ⋮ |

FIG. 31

| | CBL1 (BL0) | CBL2 (BL1) | CBL3 (BL2) | CBL4 (BL3) | CBL1 (BL4) | CBL2 (BL5) | CBL3 (BL6) | CBL4 (BL7) | CBL1 (BL8) | ⋮ |
|---|---|---|---|---|---|---|---|---|---|---|
| SU1 | FREE | X1 | X2 | X3 | FREE | X5 | X6 | X7 | FREE | |
| SU2 | X0 | X1 | X2 | X3 | X4 | X5 | X6 | X7 | X8 | ⋮ |
| SU3 | X0 | X1 | X2 | X3 | X4 | X5 | X6 | X7 | X8 | ⋮ |
| SU4 | X0 | X1 | X2 | X3 | X4 | X5 | X6 | X7 | X8 | ⋮ |
| SU5 | X0 | FREE | FREE | FREE | X4 | FREE | FREE | FREE | X8 | |

SEMICONDUCTOR STORAGE DEVICE

CROSS-REFERENCE TO RELATED APPLICATION

This application is a divisional of U.S. patent application Ser. No. 16/292,040, filed Mar. 4, 2019, which application is based upon and claims the benefit of priority from Japanese Patent Application No. 2018-135193, filed Jul. 18, 2018, the entire contents of which are incorporated herein by reference.

FIELD

Embodiments described herein relate generally to a semiconductor storage device.

BACKGROUND

A semiconductor storage device having memory cells arranged in three dimensions is known.

DESCRIPTION OF THE DRAWINGS

FIG. 12 is a table that illustrates locations of cell transistors in the same layer of the semiconductor memory of the first embodiment, that are free to store user data or are not free to store user data.

FIG. 16 is a table that illustrates locations of cell transistors in the same layer of a semiconductor memory according to a second embodiment, that are free to store user data or are not free to store user data.

FIG. 21 is a table that illustrates locations of cell transistors in the same layer of the semiconductor memory of the third embodiment, that are free to store user data or are not free to store user data.

FIG. 23 is a table that illustrates locations of cell transistors in the same layer of a semiconductor memory according to a fourth embodiment, that are free to store user data or are not free to store user data.

FIG. 25 is a table that illustrates locations of cell transistors in the same layer of a semiconductor memory according to a fifth embodiment, that are free to store user data or are not free to store user data.

FIG. 29 is a table that illustrates locations of cell transistors in the same layer of a semiconductor memory according to a sixth embodiment, that are free to store user data or are not free to store user data.

FIG. 31 is a table that illustrates locations of cell transistors in the same layer of a semiconductor memory according to a seventh embodiment, that are free to store user data or are not free to store user data.

DETAILED DESCRIPTION

Embodiments provide a semiconductor storage device having improved performance.

In general, according to one embodiment, a semiconductor storage device includes a first semiconductor extending above a substrate and including a first part that extends above the substrate and a second part that extends above the substrate, a first word line at a first level above the substrate and facing the first part of the first semiconductor, a second word line at the first level above the substrate and facing the second part of the first semiconductor, such that the first semiconductor is between the second word line and the first word line, and the second word line is separate from the first word line, a first cell transistor including a first area of the first part of the first semiconductor that faces the first word line, and a second cell transistor including a second area of the second part of the first semiconductor that faces the second word line, wherein during an operation of reading data from the first cell transistor, a first voltage that is less than a threshold voltage of the second cell transistor and greater than or equal to zero voltage is applied to the second word line.

Hereinafter, embodiments will be described with reference to the drawings. In the following descriptions, components having substantially the same function and structure are given the same reference symbols. Repetitive descriptions may be omitted. The drawings are schematic, and thus the relationship between the thickness and the plane dimension, the ratio between the thicknesses of layers, and the like may be different from actual ones. The drawings may also be partially different in relationship between dimensions or in ratio. All descriptions of certain embodiments also are applied as descriptions of other embodiments, unless explicitly excluded or obviously not applicable.

In this specification and claims, a first element "connected" to a second element means that the first element is directly or indirectly connected to the second element via an element which is normally or selectively made conductive.

First Embodiment 1.1. Structure (Configuration)

Figure 1:
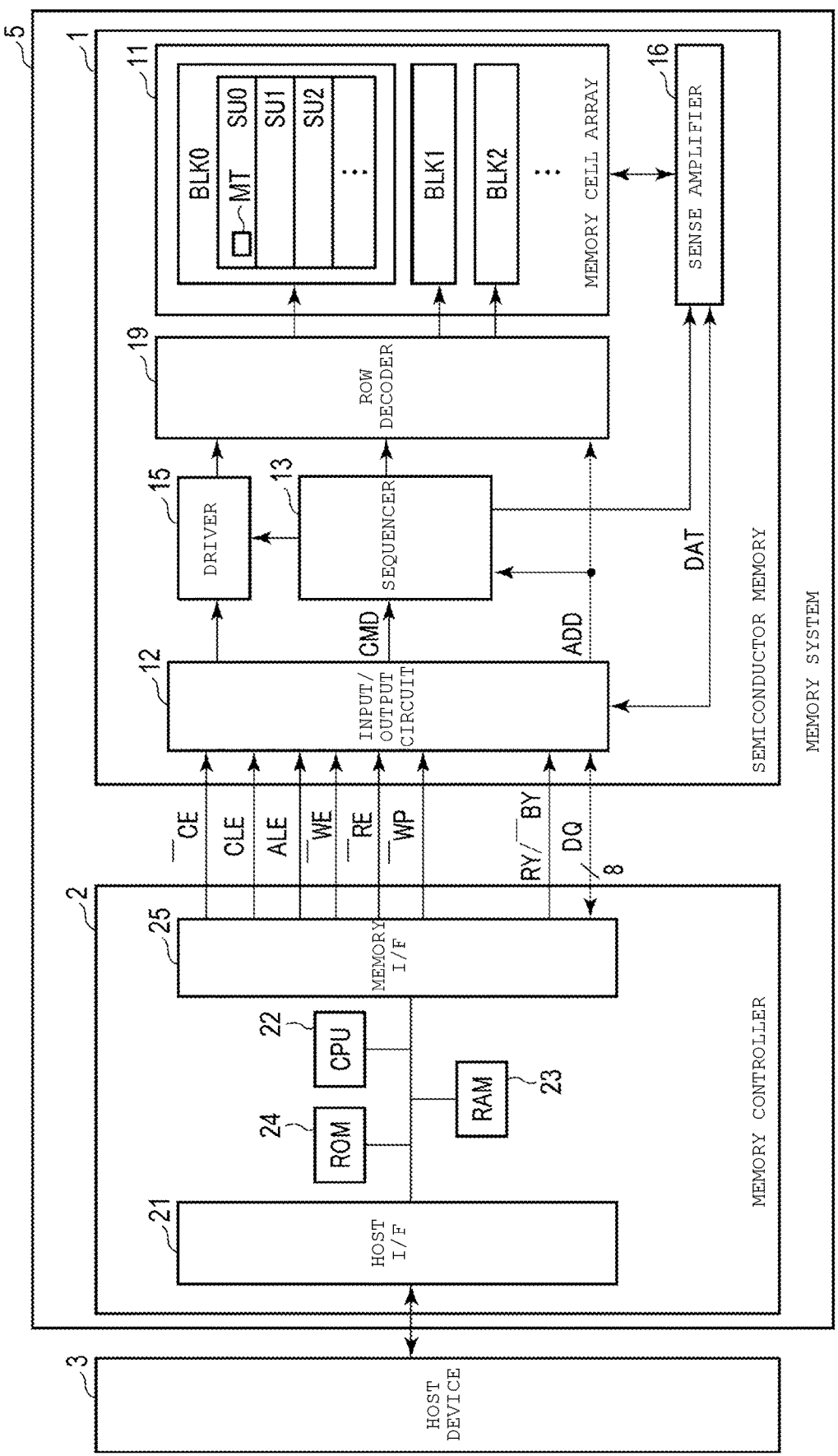
FIG. 1 is a block diagram of a memory system according to a first embodiment.

FIG. 1 is a block diagram of a memory system according to a first embodiment. As illustrated in FIG. 1, a memory system 5 is connected to a host device 3 and includes a semiconductor memory 1 and a memory controller 2. The memory system 5 may be a solid state drive (SSD) or an SD™ card, for example.

The semiconductor memory 1 is controlled by the memory controller 2. The memory controller 2 receives a command from the host device 3 and controls the semiconductor memory 1 based on the received command.

1.1.1. Memory Controller

The memory controller 2 includes a host interface 21, a central processing unit (CPU) 22, a random access memory (RAM) 23, a read only memory (ROM) 24, and a memory interface 25. The memory controller 2 may be a system-on-chip (SoC), for example.

The CPU 22 executes firmware (more generally, program) which has been stored in the ROM 24 and then loaded in the RAM 23, to perform various operations and some of functions of the host interface 21 and the memory interface 25. The RAM 23 functions as a buffer and a cache for temporarily storing data.

The host interface 21 is connected to the host device 3 via a bus and handles the communication between the memory controller 2 and the host device 3. The memory interface 25 is connected to the semiconductor memory 1 and handles the communication between the memory controller 2 and the semiconductor memory 1.

1.1.2. Semiconductor Memory

The semiconductor memory 1 includes elements such as a memory cell array (cell array) 11, an input/output circuit 12, a sequencer (which is a control circuit) 13, a driver 15, a sense amplifier 16, and a row decoder 19.

The cell array 11 includes a plurality of memory blocks (blocks) BLK (BLK0, BLK1, ... ). Each block BLK is a set of a plurality of string units SU (SU0, SU1, ... ). Each string unit SU is a set of a plurality of NAND strings (strings) STR (STR0, STR1, ... ) (not illustrated). The string STR includes a plurality of memory cell transistors (cell transistors) MT.

The input/output circuit 12 is connected to the memory controller 2 via a NAND bus. The NAND bus transfers signals ⁻CE, CLE, ALE, ⁻WE, ⁻RE, ⁻WP, and RY/⁻BY and a signal DQ having a width of 8 bits. The symbol "⁻" ahead of the name of a signal indicates an inverted logic of a signal having a name without the symbol "⁻", and means that the signal with the symbol "⁻" is asserted when the signal is at a low level.

The input/output circuit 12 receives the signal DQ and transmits the signal DQ. The input/output circuit 12 receives various control signals from the memory controller 2. The input/output circuit 12 fetches and outputs the signal DQ based on the control signal. The control signal includes the signals ⁻CE, CLE, ALE, ⁻WE, ⁻RE, and ⁻WP.

The signal DQ may contain a command (CMD), write data or read data (DAT), an address signal (ADD), status data (STA), and the like.

The sequencer 13 receives the command CMD and the address signal ADD from the input/output circuit 12, and controls the driver 15, the sense amplifier 16, and the row decoder 19 based on the command CMD and the address signal ADD.

The driver 15 supplies a voltage selected among a plurality of voltages to the row decoder 19. The row decoder 19 receives various voltages from the driver 15 and receives the address signal ADD from the input/output circuit 12. The row decoder 19 selects one block BLK based on the received address signal ADD and transfers the voltage received from the driver 15 to the selected block BLK.

The sense amplifier 16 senses the state of the cell transistor MT. The sense amplifier 16 generates read data based on the sensed state and also applies a voltage to the cell transistor MT according to write data.

1.1.3. Cell Array

Figure 2:
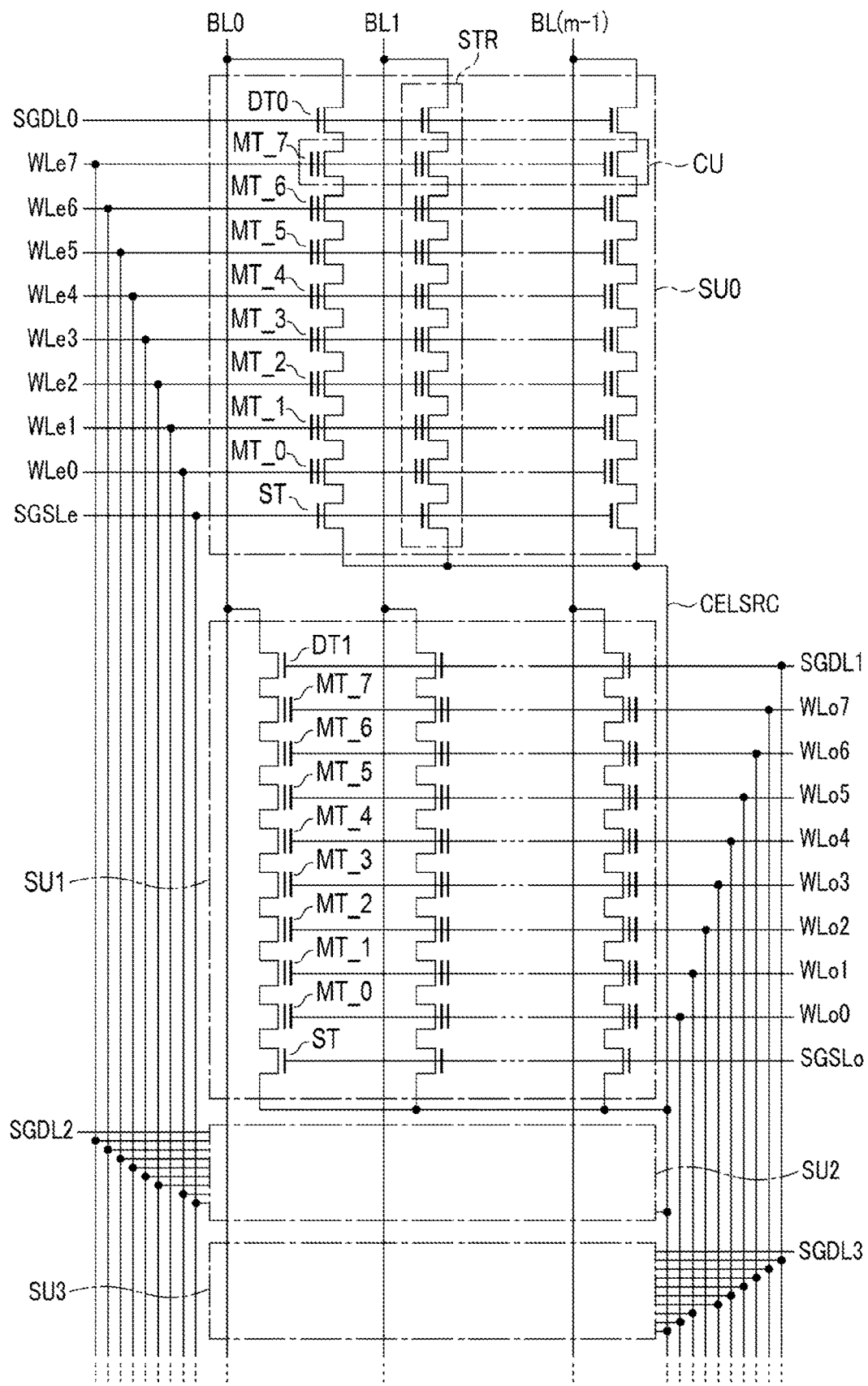
FIG. 2 is a circuit diagram illustrating a part of a cell array in the first embodiment.

FIG. 2 is a circuit diagram illustrating a part of the cell array 11 in the first embodiment and illustrates elements, connections, and related elements in one block BLK0. A plurality (for example, all) of blocks BLK includes the elements and connections illustrated in FIG. 2.

One block BLK includes n pieces of string units SU (SU0, SU1, SU2, . . . , and SU (n−1), where n is 2 or more, for example, 8). The following descriptions will be made based on this example. Each string unit SU is connected to m pieces (m is a natural number) of bit lines BL (BL0 to BL (m−1)).

Each string unit SU includes a plurality of NAND strings STR. Each NAND string STR includes one select gate transistor ST, a plurality (for example, 8) of memory cell transistors MT (MT_0 to MT_7), and one select gate transistor DT (DT0, DT1, DT2, . . . , or DT7). The transistors ST, MT, and DT are connected in series between a cell source line CELSRC and one bit line BL, in this order. The cell transistor MT includes a control gate electrode and a charge storage layer insulated from the surrounding. The cell transistor MT is capable of storing data based on the amount of charges in the charge storage layer, in a nonvolatile manner.

Control gate electrodes of the cell transistors MT_0 to MT_7 in a string unit SUα (where α is an even number) are connected to word lines WLe0 to WLe7, respectively. A set of cell transistors MT sharing word lines WL (WLe0 to WLe7 and WLo0 to WLo7 (described later)) in one string unit SU is referred to as a cell unit CU. A gate electrode of a transistor ST in the string unit SUα is connected to a select gate line SGSLe.

Control gate electrodes of the cell transistors MT_0 to MT_7 in a string unit SUβ (where β is an odd number) are connected to word lines WLo0 to WLo7, respectively. A gate electrode of a transistor ST in the string unit SUβ is connected to a select gate line SGSLo.

A transistor DTγ (where γ is a natural number which is 0 or equal to or less than (n−1)), belongs to a string unit SUγ. A gate electrode of each transistor DTγ in a plurality of strings STR in the string unit SUγ is connected to a select gate line SGDLγ.

1.1.4. Cell Transistor

Figure 3:
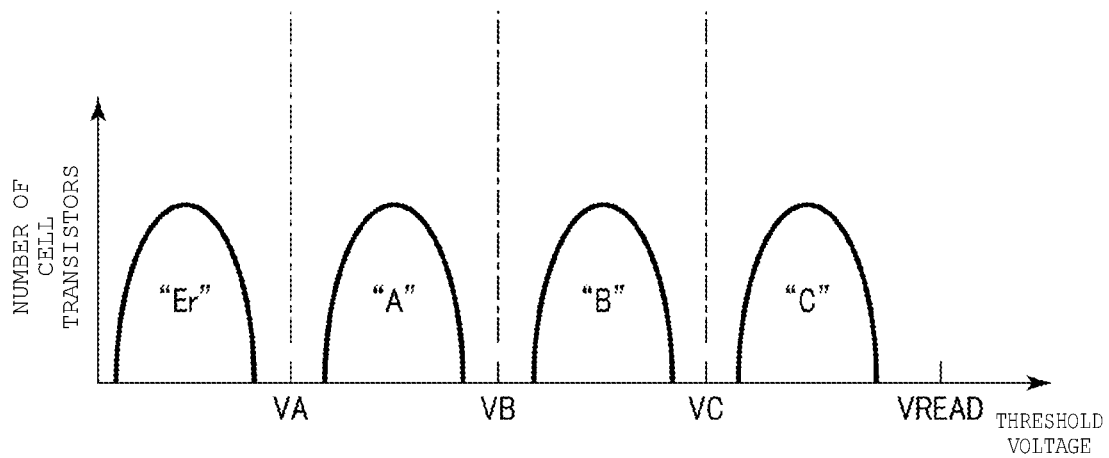
FIG. 3 illustrates distribution of a threshold voltage of a cell transistor storing 2-bit data in the first embodiment.

The cell transistor MT will be described with reference to FIG. 3. The semiconductor memory 1 is capable of storing data of 2 bits or more in one cell transistor MT. FIG. 3 illustrates distribution of a threshold voltage of the cell transistor MT that stores 2-bit data. The threshold voltage of each cell transistor MT has a value depending on the stored data. In a case where 2-bit data is stored, each cell transistor MT may have any of four threshold voltages. The four threshold voltages correspond to states of storing "11" data, "01" data, "00" data, and "10" data, respectively. The cell transistor MT in the states of storing "11" data, "01" data, "00" data, and "10" data is referred to as being in Er, A, B, and C states.

Even though a plurality of cell transistors MT store the same 2-bit data, the cell transistors MT may have threshold voltages different from each other due to variations in characteristics of the cell transistor MT, for example. Therefore, the plurality of cell transistors MT storing the same 2-bit data have different threshold voltages.

The state of a cell transistor MT is determined in order to determine data stored by the cell transistor MT as a read target. Read voltages VA, VB, and VC are used for determining the state. A voltage which includes the read voltages VA, VB, and VC, has a certain magnitude, and is applied to the cell transistor MT as the read target for determining the state of the cell transistor MT may be referred to as a read voltage VCGR below.

Whether or not the threshold voltage of the cell transistor MT that is the read target exceeds the read voltage VCGR is used for determining the state of the threshold voltage of the cell transistor MT. A cell transistor MT having a threshold voltage which is equal to or higher than the read voltage VCGR maintains an OFF state even though the control gate electrode receives the read voltage VCGR. A cell transistor MT having a threshold voltage which is lower than the read voltage VCGR turns ON if the control gate electrode receives the read voltage VCGR. A voltage VREAD is applied to the word line WL of a cell transistor MT in a cell unit CU that is a non-read target and is higher than a threshold voltage of the cell transistor MT in any state.

A data set of bits at the same bit position in the cell transistor MT of one cell unit CU makes up one page. A data set of upper bits in a cell transistor MT of one cell unit is referred to as an upper page, and a data set of lower bits in the cell transistor MT of the one cell unit is referred to as a lower page.

The storage of data having 3 bits or more per cell transistor MT can be also achieved as an extension of the above-described principle by those skilled in the art.

Figure 4:
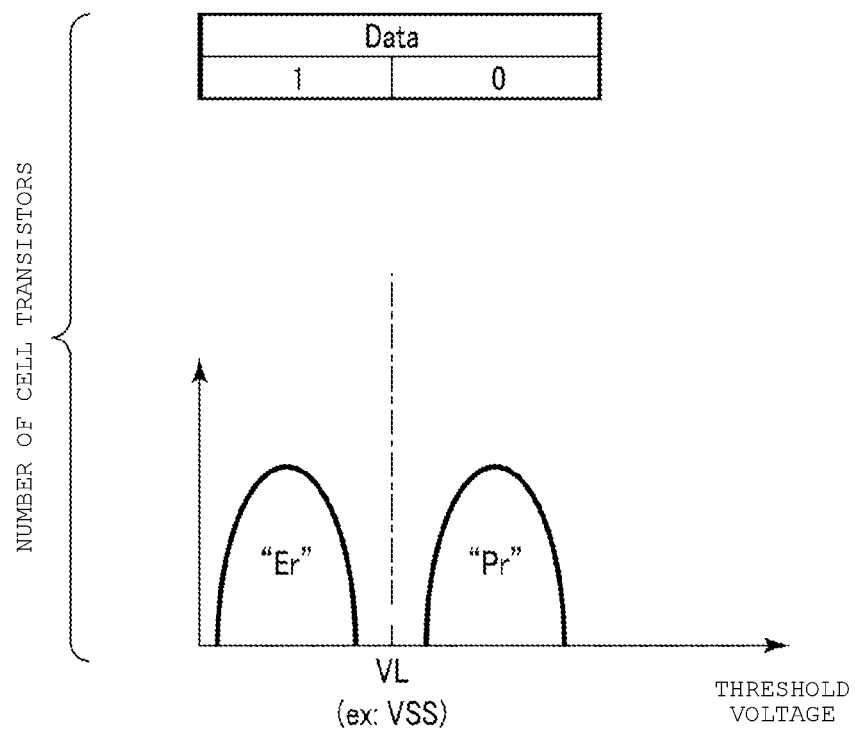
FIG. 4 illustrates distribution of a threshold voltage of a cell transistor storing 1-bit data in the first embodiment.

The semiconductor memory 1 is also capable of storing 1-bit data in one cell transistor MT. FIG. 4 illustrates distribution of a threshold voltage of a cell transistor MT storing 1-bit data per cell transistor MT in the first embodiment. As illustrated in FIG. 4, when 1-bit data is written in a cell transistor MT, such a cell transistor MT is in any of two states and has one state (which is the programmed state) in addition to an Er state. The programmed state (referred to as "a Pr state" below) can be treated as storing "0" data, for example. A read voltage VL is used for determining whether a cell transistor MT which is a read target is in an Er state or a Pr state. A cell transistor MT in the Pr state has a threshold voltage which is equal to or greater than the read voltage VL. The read voltage VL is also included in the read voltage VCGR. The read voltage VL is, for example, a voltage VSS (=0 V).

1.1.5. Structure of Cell Array

In the semiconductor memory 1, two cell transistors MT which are located in one layer and are adjacent to each other may have sizes which differ from each other, based on the structure and the manufacturing method thereof. Such a structure may be provided in various forms, and an example will be described below. However, the first embodiment is not limited by the structure of a cell transistor MT and the structure of a cell array 11 given in the example below.

Figure 5:
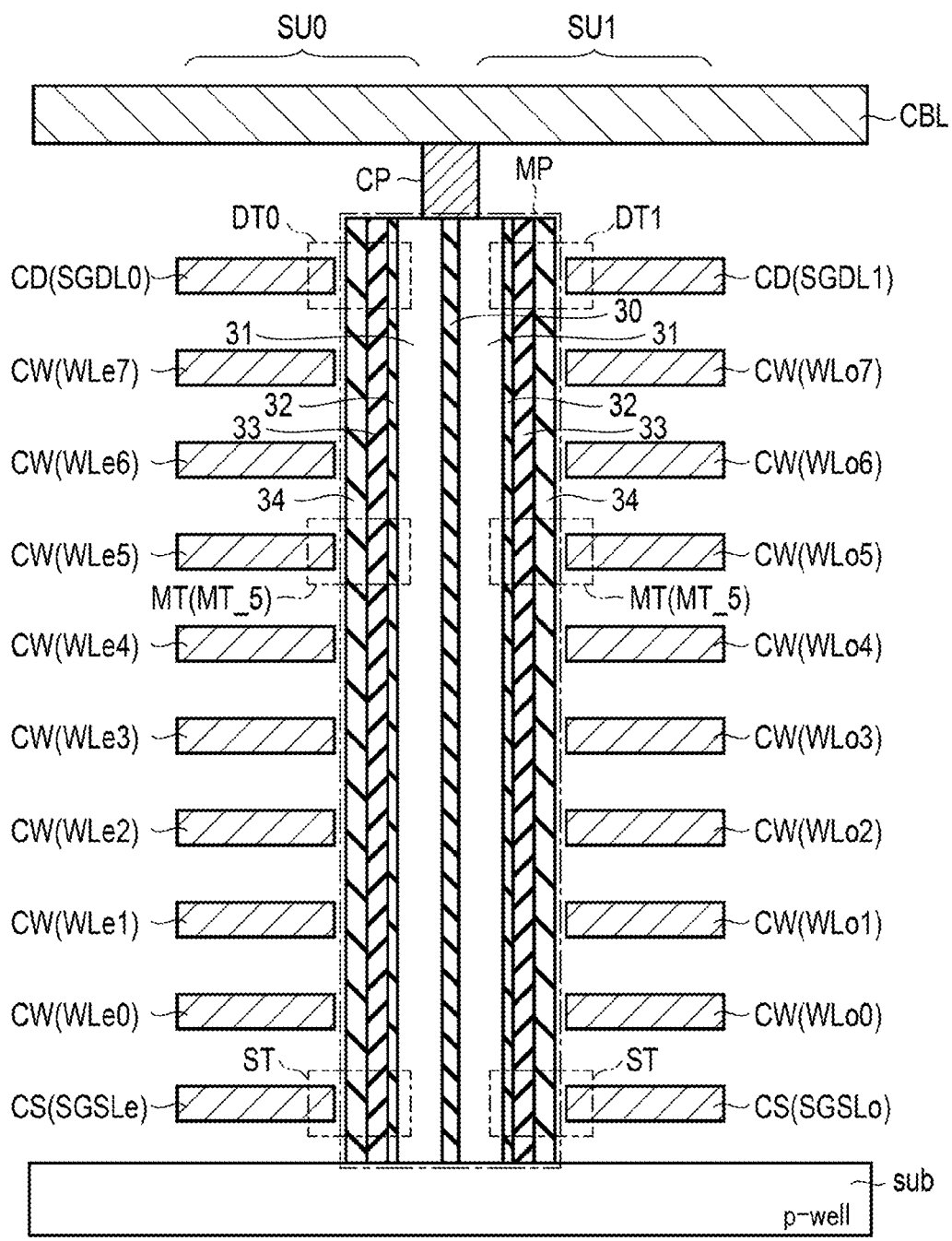
FIG. 5 schematically illustrates a cross-section of a part of a semiconductor memory in the first embodiment.

FIG. 5 schematically illustrates a cross-section of a part of the semiconductor memory in the first embodiment. Specifically, FIG. 5 illustrates the structure of two string units SU which are adjacent to each other and have two different addresses in the semiconductor memory 1. FIG. 5 illustrates a cross-section of string units SU0 and SU1. Other sets of string units SU also have the same structure as that in FIG. 5.

As illustrated in FIG. 5, the string units SU0 and SU1 are formed on a semiconductor substrate sub, in particular, on a p-well in an area of an xy plane surface of the semiconductor substrate.

A memory pillar MP is connected to the substrate sub. The memory pillar MP extends along a z-axis and includes an insulator 30, a semiconductor 31, an insulator 32, an insulator 33, and an insulator 34.

The insulator 30 has a columnar shape extending along the z-axis. The insulator 30, for example, contains a silicon oxide or is made of silicon oxide. The semiconductor 31 extends along the z-axis and surrounds the insulator 30. The semiconductor 31 functions as a part of a channel of a cell transistor MT. The semiconductor 31, for example, contains polycrystalline silicon or is made of polycrystalline silicon. The insulator 32 extends along the z-axis and surrounds the semiconductor 31. The insulator 32 functions as a gate insulator of the cell transistor MT. The insulator 32 includes a layer of a silicon oxide or a layer of a silicon nitride, for example. The insulator 33 extends along the z-axis and surrounds the insulator 32. The insulator 33 functions as a charge storage layer of the cell transistor MT. The insulator 33, for example, contains a silicon nitride or is made of silicon nitride. The insulator 34 extends along the z-axis and surrounds the insulator 33. The insulator 34 functions as a block insulator of the cell transistor MT. The insulator 34, for example, contains a silicon oxide or is made of silicon oxide.

Plural sets of conductors are provided on each of both sides of the memory pillar MP above the substrate sub. Each set of conductors is stacked along the z-axis and includes a conductor CS, eight conductors CW, and a conductor CD in a direction away from the substrate sub. The conductors CS, CW, and CD are electrically separated from each other. The conductor CS, the eight conductors CW, and the conductor CD, for example, contain tungsten or is made of tungsten.

The string unit SU0 is located on a first side (for example, left side) of the memory pillar MP. The conductor CS, the eight conductors CW, and the conductor CD on the first side of the memory pillar MP function as the select gate line SGSLe, the word lines WLe0, WLe1, WLe2, WLe3, WLe4, WLe5, WLe6, and WLe7, and the select gate line SGDL0, respectively.

The string unit SU1 is located on a second side (for example, right side) of the memory pillar MP. The conductor CS, the eight conductors CW, and the conductor CD on the second side of the memory pillar MP function as the select gate line SGSLo, the word lines WLo0, WLo1, WLo2, WLo3, WLo4, WLo5, WLo6, and WLo7, and a select gate line SGDL1, respectively.

Parts of the semiconductor 31, the insulator 32, the insulator 33, and the insulator 34, which face the conductor CS function as the select gate transistor ST. Parts of the semiconductor 31, the insulator 32, the insulator 33, and the insulator 34, which face the conductors CW function as the cell transistor MT. Parts of the semiconductor 31, the insulator 32, the insulator 33, and the insulator 34, which face the conductor CD function as the select gate transistor DT.

The transistors ST, MT, and DT arranged along the z-axis correspond to transistors in one string STR.

A conductor CBL is provided above the memory pillar MP. The conductor CBL functions as the bit line BL. The conductor CBL extends along a y-axis. The conductor CBL is connected to the upper surface of the memory pillar MP via a contact plug CP.

A plurality of strings STR are provided at different positions along an x-axis direction. Such plurality of strings STR provided at the different positions along the x-axis direction correspond to strings STR in one string unit SU.

In FIG. 5, an insulator is provided in an area other than an area for the elements illustrated in FIG. 5, for example, area between the conductor CS and the conductor CW, area between the eight conductors CW, and area between the conductor CW and the conductor CD.

Figure 6:
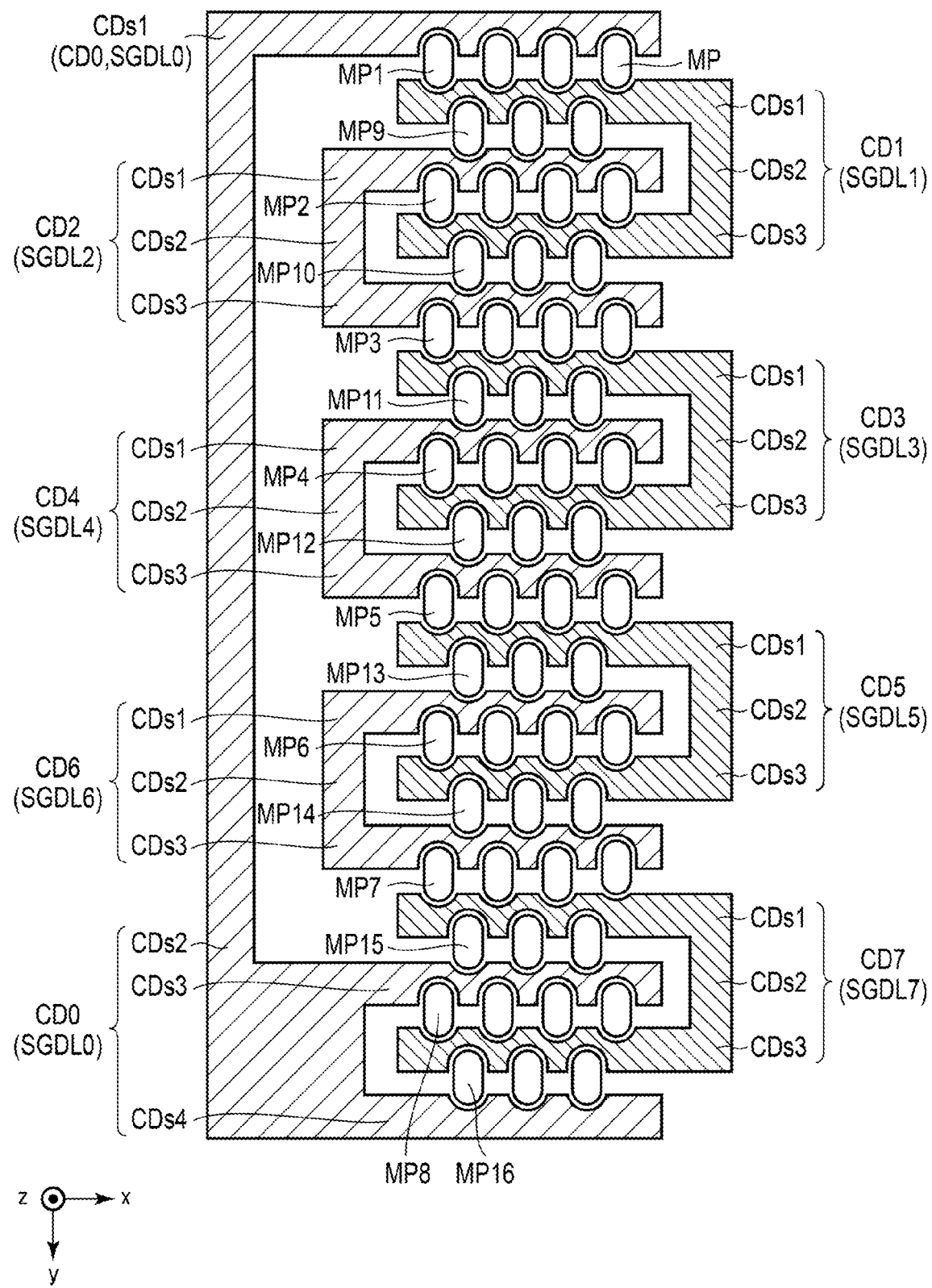
FIG. 6 is a plan view of one layer of a part of the semiconductor memory in the first embodiment.

FIG. 6 is a plan view of one layer of a part of the semiconductor memory 1. More specifically, FIG. 6 illustrates a layer on which the conductor CD (conductor functioning as the select gate line SGDL) is located, along the xy plane.

As illustrated in FIG. 6, eight individual conductors CD0 to CD7 are provided as the conductor CD. The conductors CD0 to CD7 function as select gate lines SGDL0 to SGDL7, respectively.

The conductor CD1 has a substantially U-shape. Specifically, the conductor CD1 includes a first part CDs1, a second part CDs2, and a third part CDs3. The first part CDs1 and the third part CDs3 extend along the x-axis. The first part CDs1 is located at a y-axis coordinate smaller than the y-axis coordinate of the third part CDs3. The second part CDs2 extends along the y-axis and connects one end (for example, right end) of the first part CDs1 and one end (for example, right end) of the third part CDs3 on the same side as the first part CDs1.

The first part CDs1 may be referred to as an upper part, the second part CDs2 may be referred to as a connection part, and the third part CDs3 may be referred to as a lower part.

Similar to the conductor CD1, each of the conductors CD2 to CD7 has a substantially U-shape and includes a first part CDs1, a second part CDs2, and a third part CDs3.

The conductors CD2, CD4, and CD6 have the connection parts CDs2 on the same side (for example, left side). The conductors CD1, CD3, CD5, and CD7 have the connection parts CDs2 on an opposite side (for example, right side) of the side on which the conductors CD2, CD4, and CD6 respectively include the connection parts CDs2.

The conductor CD0 also includes an upper part CDs1, a connection part CDs2, and a lower part CDs3. The conductor CD0 further includes a fourth part CDs4 extending along the x-axis. The fourth part CDs4 may be referred to as a lowest horizontal part. The connection part CDs2 connects the upper part CDs1, the lower part CDs3, and the lowest horizontal part CDs4. The connection part CDs2 of the conductor CD0 is located, for example, on the same side (for example, left side) as the side on which the conductors CD2, CD4, and CD6 respectively include the connection parts CDs2.

The conductors CD2, CD4, and CD6 are arranged in this order from the top to the bottom in FIG. 6, along the y-axis. The conductors CD1, CD3, CD5, and CD7 are arranged in this order from the top to the bottom in FIG. 6, along the y-axis.

The upper part CDs1 of each of the conductors CD2, CD4, CD6 is located between the upper part CDs1 and the lower part CDs3 of each of the conductors CD1, CD3, CD5, respectively. More specifically, from the top to the bottom along the y-axis, the upper part CDs1 of the conductor CD0, the upper part CDs1 of the conductor CD1, the upper part CDs1 of the conductor CD2, the lower part CDs3 of the conductor CD1, the lower part CDs3 of the conductor CD2, the upper part CDs1 of the conductor CD3, the upper part CDs1 of the conductor CD4, the lower part CDs3 of the conductor CD3, the lower part CDs3 of the conductor CD4, the upper part CDs1 of the conductor CD5, the upper part CDs1 of the conductor CD6, the lower part CDs3 of the conductor CD5, the lower part CDs3 of the conductor CD6, the upper part CDs1 of the conductor CD7, the lower part CDs3 of the conductor CD0, the lower part CDs3 of the conductor CD7, and the lowest horizontal part CDs4 of the conductor CD0 are arranged in this order.

Regarding the upper parts CDs1 and the lower parts CDs3 of the conductors CD0 to CD7 and the lowest horizontal part CDs4 of the conductor CD0, the memory pillar MP is provided between two parts which are adjacent to each other along the y-axis. The memory pillar MP has a structure for forming the cell transistors MT0 to MT7 and the select gate transistors DT and ST. Details thereof will be described later. FIG. 6 illustrates three or four memory pillars MP arranged along different directions along the x-axis. However, any number of memory pillars MP may be provided in other embodiments.

The memory pillar MP includes plural sets of memory pillars MP1 to MP16. Each of the plural sets of the memory pillars MP1 to MP16 include three or four memory pillars MP that are arranged along the x-axis.

The memory pillar MP1 is located between the upper part CDs1 of the conductor CD0 and the upper part CDs1 of the conductor CD1. The memory pillar MP2 is located between the upper part CDs1 of the conductor CD2 and the lower part CDs3 of the conductor CD1. The memory pillar MP3 is located between the lower part CDs3 of the conductor CD2 and the upper part CDs1 of the conductor CD3. The memory pillar MP4 is located between the upper part CDs1 of the conductor CD4 and the lower part CDs3 of the conductor CD3. The memory pillar MP5 is located between the lower part CDs3 of the conductor CD4 and the upper part CDs1 of the conductor CD5. The memory pillar MP6 is located between the upper part CDs1 of the conductor CD6 and the lower part CDs3 of the conductor CD5. The memory pillar MP7 is located between the lower part CDs3 of the conductor CD6 and the upper part CDs1 of the conductor CD7. The memory pillar MP8 is located between the lower part CDs3 of the conductor CD0 and the lower part CDs3 of the conductor CD7.

The memory pillar MP9 is located between the upper part CDs1 of the conductor CD1 and the upper part CDs1 of the conductor CD2. The memory pillar MP10 is located between the lower part CDs3 of the conductor CD1 and the lower part CDs3 of the conductor CD2. The memory pillar MP11 is located between the upper part CDs1 of the conductor CD3 and the upper part CDs1 of the conductor CD4. The memory pillar MP12 is located between the lower part CDs3 of the conductor CD3 and the lower part CDs3 of the conductor CD4. The memory pillar MP13 is located between the upper part CDs1 of the conductor CD5 and the upper part CDs1 of the conductor CD6. The memory pillar MP14 is located between the lower part CDs3 of the conductor CD5 and the lower part CDs3 of the conductor CD6. The memory pillar MP15 is located between the upper part CDs1 of the conductor CD7 and the lower part CDs3 of the conductor CD0. The memory pillar MP16 is located between the lower part CDs3 of the conductor CD7 and the lowest horizontal part CDs4 of the conductor CD0.

The memory pillars MP1, MP2, MP3, MP4, MP5, MP6, MP7, and MP8 are arranged along the y-axis. The memory pillars MP9, MP10, MP11, MP12, MP13, MP14, MP15, and MP16 are arranged along the y-axis.

The memory pillars MP faces the conductor CD through an insulator (not illustrated). Each memory pillar MP is desirably centered between the conductor part CDs1 (or CDs3) that is above (in the drawing) the memory pillar MP and the conductor part CDs1 (or CDs3 or CDs4) that is below (in the drawing) the memory pillar MP. The memory pillars MP may be shifted upward or downward from the center location unintentionally. FIG. 6 illustrates such a practical structure and illustrates a case where the memory pillars MP are shifted upward from the desired location, as an example. With such arrangement of the memory pillars MP, each memory pillar MP faces the conductor part CDs1 or CDs3 above the memory pillar MP, for a predetermined length D1 and faces the conductor part CDs1, CDs3, or CDs4 below the memory pillar MP for a predetermined length D2, where D1 and D2 have a relationship of D1>D2.

Figure 7:
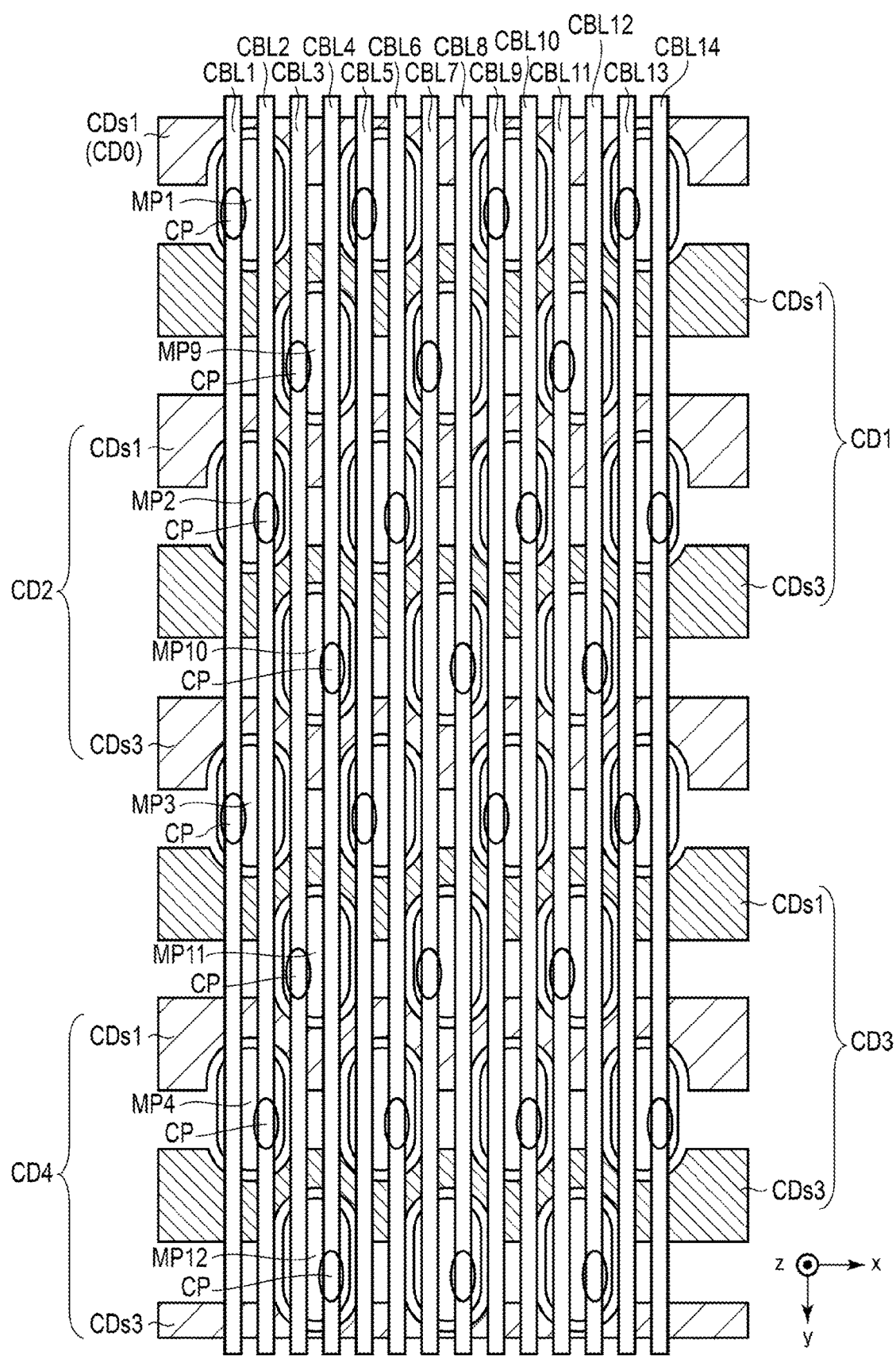
FIG. 7 is another plan view of the part of the semiconductor memory shown in FIG. 6.

FIG. 7 is another plan view of the part of the semiconductor memory shown in FIG. 6. FIG. 7 illustrates a view obtained by enlarging the part in FIG. 6 and depicting elements on a layer above the layer illustrated in FIG. 6, in the z-axis direction.

A plurality of conductors CBL (CBL1, CBL2, . . . , and CBL14) are located on the layer above the conductor CD, in the z-axis direction. The conductor CBL functions as the bit line BL. The conductors CBL extend along the y-axis and are arranged in parallel in the x-axis direction. Two adjacent conductors CBL extend above columns of the memory pillars MP arranged along one y-axis direction, in the z-axis direction. Each conductor CBL is connected to alternate memory pillars MP among a plurality of memory pillars MP belonging to the same column, by contact plugs CP. Two conductors CBL overlapping a certain column of memory pillars MP are connected to different memory pillars MP by contact plugs CP. With such connections, four adjacent conductors CBL constitute one set, and this set is repeated along the x-axis. That is, regarding the value of p (p is zero or a natural number), which is 0 or the natural number, each set of the conductor CBL includes conductors CBL(4p+1), CBL(4p+2), CBL(4p+3), and CBL(4p+4). The conductors CBL(4p+1), CBL(4p+2), CBL(4p+3), and CBL(4p+4) are connected to the memory pillars MP as follows. In the following descriptions, the description including "p" is applied as equal to the value of 0 or a natural number, even if not explicitly mentioned. A case where p is 0, that is, a case where descriptions are made on the assumption that p only represents a set of conductors CBL1, CBL2, CBL3, and CBL4 may be provided. These descriptions are also applied to each case where p has a value other than 0. That is, the following descriptions of the conductors CBL1, CBL2, CBL3, and CBL4 are applied to the conductors CBL(4p+1), CBL(4p+2), CBL(4p+3), and CBL(4p+4), respectively, for each natural number of p.

The conductor CBL(4p+1) is connected to the memory pillars MP1 and MP3 and further connected to the memory pillars MP5 and MP7 (not illustrated). The conductor CBL(4p+2) is connected to the memory pillars MP2 and MP4 and further connected to the memory pillars MP6 and MP8 (not illustrated). The conductor CBL(4p+3) is connected to the memory pillars MP9 and MP11 and further connected to the memory pillars MP13 and MP15 (not illustrated). The conductor CBL(4p+4) is connected to the memory pillars MP10 and MP12 and further connected to the memory pillars MP14 and MP16 (not illustrated).

Figure 8:
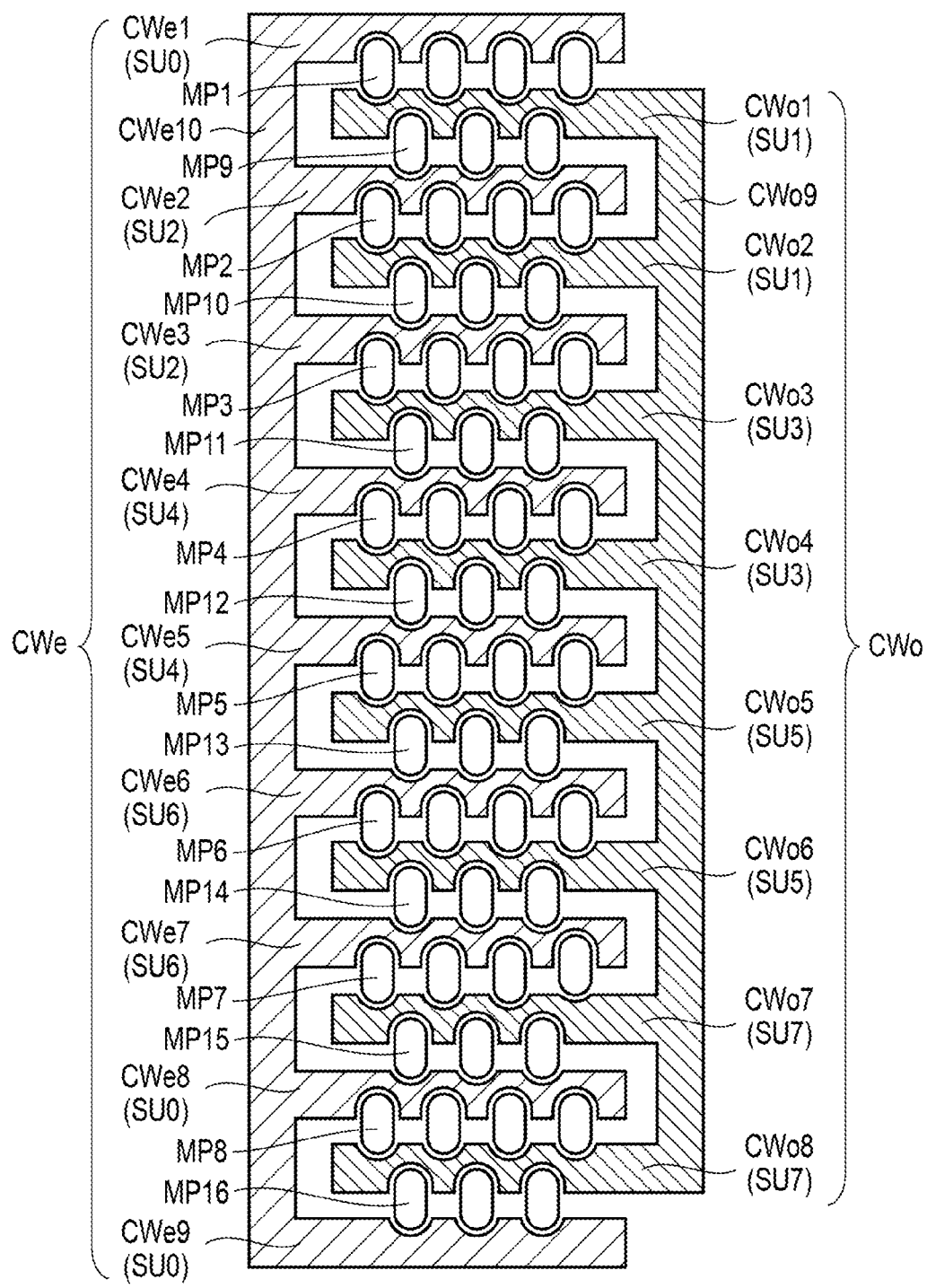
FIG. 8 is a plan view of another layer of a part of the semiconductor memory in the first embodiment.

FIG. 8 is a plan view of another layer of a part of the semiconductor memory in the first embodiment. More specifically, FIG. 8 illustrates the structure of the conductor CW in the xy plane.

As illustrated in FIG. 8, conductors CWe and CWo are provided as the conductor CW. In the structure of the word lines WLeZ and WLoZ (where Z is 0 or a natural number) illustrated in FIG. 8, the conductor CWe functions as the word line WLeZ, and the conductor CWo functions as the word line WLoZ.

The conductor CWe includes parts CWe1, CWe2, CWe3, CWe4, CWe5, CWe6, CWe7, CWe8, CWe9, and CWe10. The conductor parts CWe1 to CWe9 extend along the x-axis. The conductor part CWe10 extends along the y-axis. Ends (for example, left ends) of the conductor parts CWe1 to CWe9 on the same side are connected to the part CWe10. In this manner, the conductor CWe has a comb shape.

The conductor CWo includes parts CWo1, CWo2, CWo3, CWo4, CWo5, CWo6, CWo7, CWo8, and CWo9. The conductor parts CWo1 to CWo8 extend along the x-axis. The conductor part CWo9 extends along the y-axis. Ends (for example, right ends) of the conductor parts CWo1 to CWo8 on an opposite side of a side (for example, left ends) on which the conductor parts CWe0 to CWe9 are connected to each other, are connected to the part CWo9. In this manner, the conductor CWo has a comb shape.

The parts CWe1, CWo1, CWe2, CWo2, CWe3, CWo3, CWe4, CWo4, CWe5, CWo5, CWe6, CWo6, CWe7, CWo7, CWe8, CWo8, and CWe9 are arranged from the top to the bottom along the y-axis, in this order.

The part CWe1 and the part CWo1 sandwich the memory pillar MP1 and face the memory pillar MP1. The part CWo1 and the part CWe2 sandwich the memory pillar MP9 and face the memory pillar MP9. The part CWe2 and the part CWo2 sandwich the memory pillar MP2 and face the memory pillar MP2. The part CWo2 and the part CWe3 sandwich the memory pillar MP10 and face the memory pillar MP10. The part CWe3 and the part CWo3 sandwich the memory pillar MP3 and face the memory pillar MP3. The part CWo3 and the part CWe4 sandwich the memory pillar MP11 and face the memory pillar MP11. The part CWe4 and the part CWo4 sandwich the memory pillar MP4 and face the memory pillar MP4. The part CWo4 and the part CWe5 sandwich the memory pillar MP12 and face the memory pillar MP12. The part CWe5 and the part CWo5 sandwich the memory pillar MP5 and face the memory pillar MP5. The part CWo5 and the part CWe6 sandwich the memory pillar MP13 and face the memory pillar MP13. The part CWe6 and the part CWo6 sandwich the memory pillar MP6 and face the memory pillar MP6. The part CWo6 and the part CWe7 sandwich the memory pillar MP14 and face the memory pillar MP14. The part CWe7 and the part CWo7 sandwich the memory pillar MP7 and face the memory pillar MP7. The part CWo7 and the part CWe8 sandwich the memory pillar MP15 and face the memory pillar MP15. The part CWe8 and the part CWo8 sandwich the memory pillar MP8 and face the memory pillar MP8. The part CWo8 and the part CWe9 sandwich the memory pillar MP16 and face the memory pillar MP16.

Figure 9:
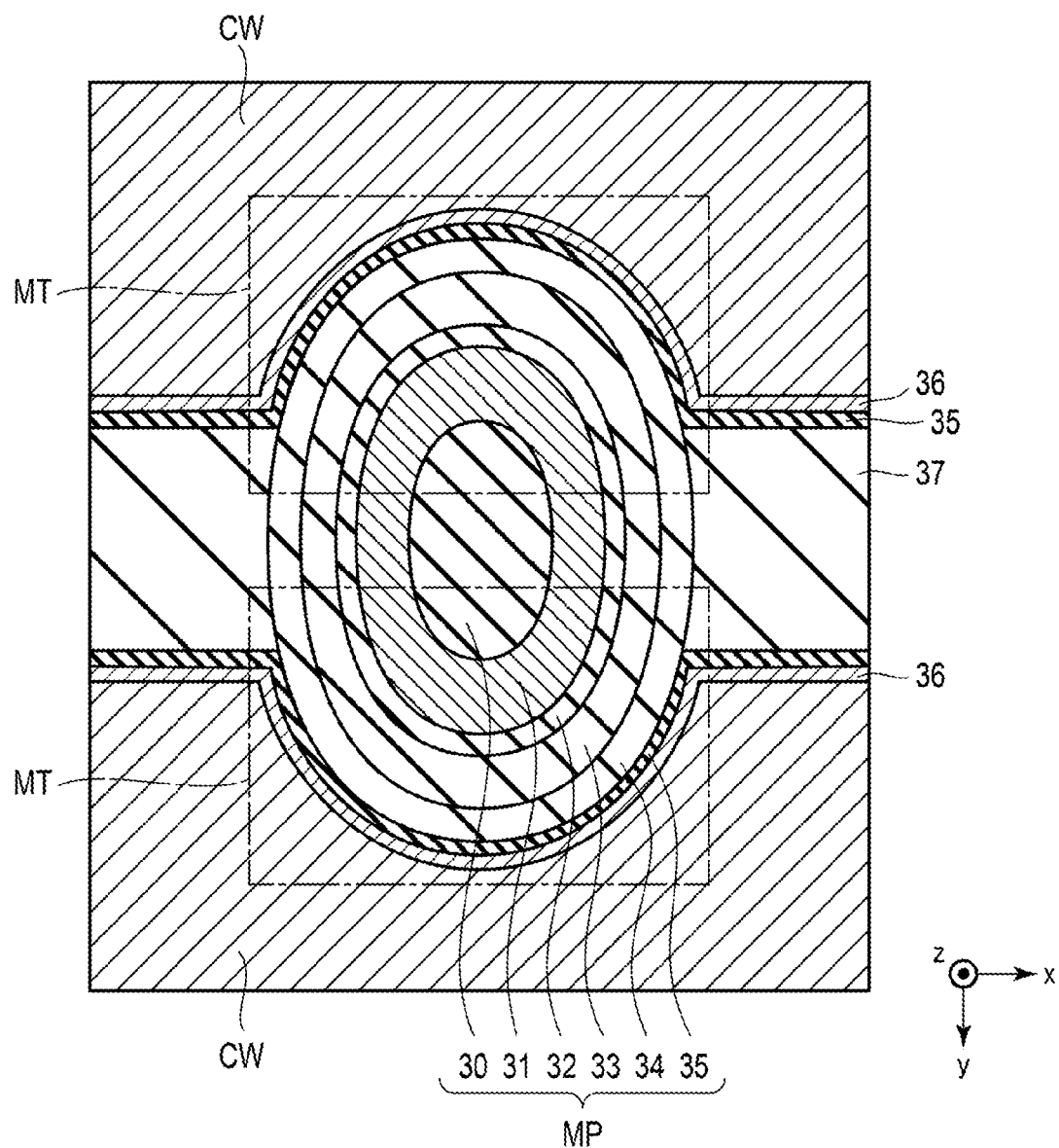
FIG. 9 illustrates a cross-section of a part of the semiconductor memory in the first embodiment.

FIG. 9 illustrates a cross-section of the memory pillar MP of the semiconductor memory 1 in the first embodiment taken along the xy plane.

As illustrated in FIG. 9 and as described with reference to FIGS. 5 and 7, the memory pillar MP is located between two conductors CW. As described with reference to FIG. 5, the memory pillar MP includes the insulator 30, the semiconductor 31, the insulator 32, the insulator 33, and the insulator 34.

An insulator 37 is provided between the two conductors CW. In addition, an insulator 35 and a conductor 36 are provided between each of the two conductors CW and the insulator 37. The conductor 36 is provided along and covers a surface of each conductor CW, which faces the memory pillar MP and an edge facing the other conductor CW. The conductor 36, for example, contains a titanium nitride or is made of a titanium nitride.

The insulator 35 covers the surface of the conductor 36. The insulator 35, for example, contains an aluminum oxide or is made of an aluminum oxide.

With such a structure, the memory pillar MP faces the conductors CW through the insulator 35 and the conductor 36.

1.2. Operation

In the semiconductor memory 1, a part of the cell array 11 is usable for a specific application. Such an application includes storage of data which is first read after the semiconductor memory 1 is powered on. First reading of data after power turns ON is referred to as power-on read. An area of the cell array 11, in which power-on read is performed is referred to as a power-on-read area.

Figure 10:
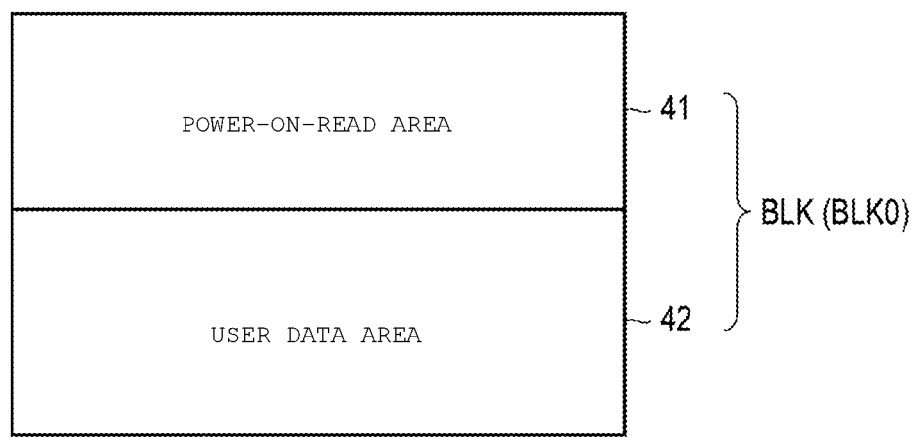
FIG. 10 schematically illustrates storage areas of a block in the semiconductor memory in the first embodiment.

As illustrated in FIG. 10, in the semiconductor memory 1, a part of the cell array 11 may be used as a power-on-read area 41. The power-on-read area 41 is, for example, a part of certain one block BLK and is, for example, a part of the block BLK0. The power-on-read area 41 may be one entire block BLK or may be a combination of parts of a plurality of blocks BLK. Generally, an access by a user of the memory system 5 to the power-on-read area 41 is not possible. The cell array 11 may include a user data area 42 in addition to the power-on-read area 41. By contrast, an access by the user of the memory system 5 to the user data area 42 is possible.

In the memory system 5, for example, 1-bit data per cell transistor MT is allowed to be written in the power-on-read area 41 (i.e., data is allowed to be written in a binary manner). The following descriptions will be made based on an example in which data is written in the power-on-read area 41 in a binary manner.

Figure 11:
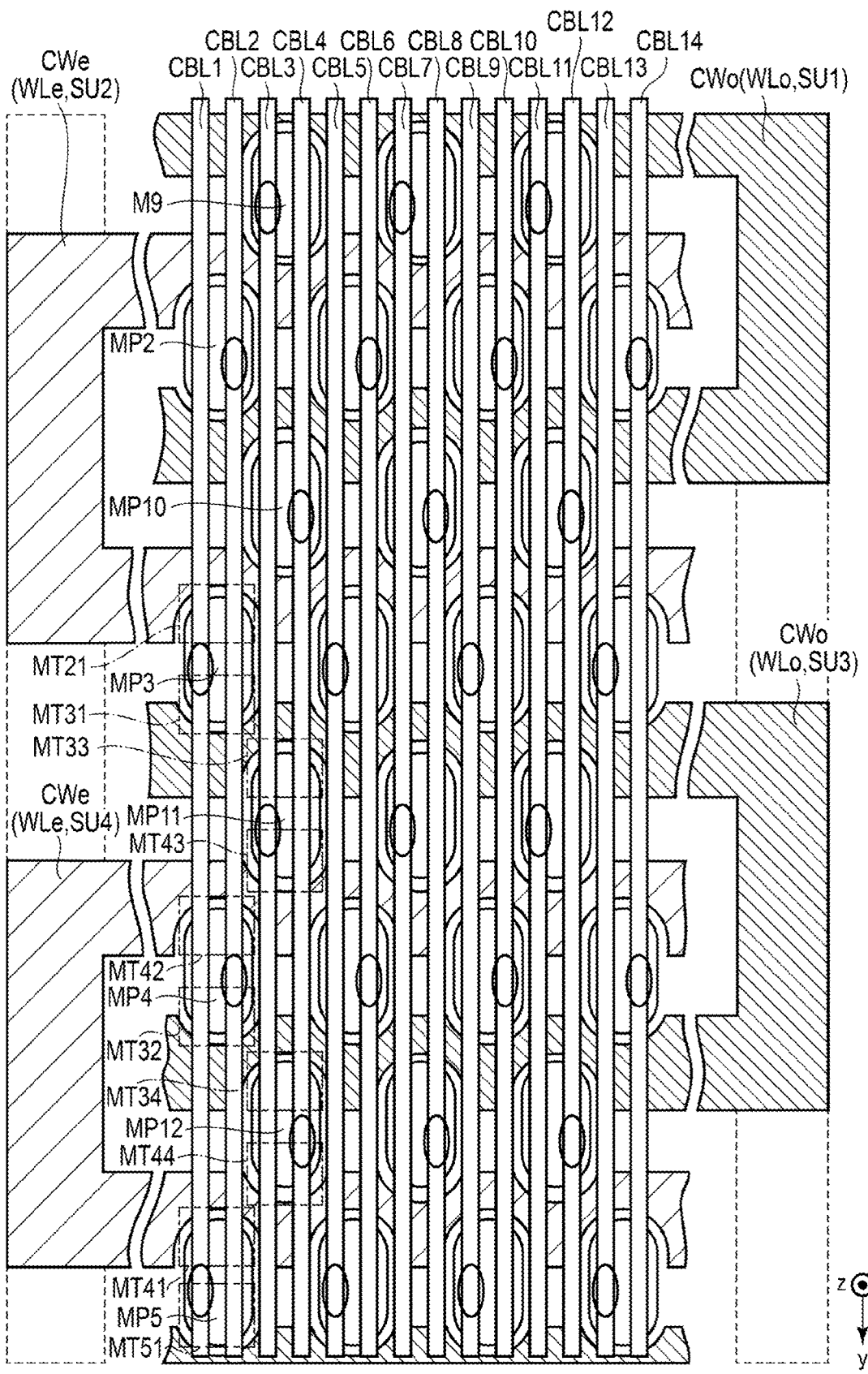
FIG. 11 is a plan view of another part of the semiconductor memory in the first embodiment.

FIG. 11 is a plan view of another part of the semiconductor memory 1 in the first embodiment. More specifically, FIG. 11 illustrates cell transistors MT and related elements in the power-on-read area 41 and illustrates a layer of a certain conductor CW, similar to FIG. 8. In order to make it easy to visually understand a string unit SU to which each cell transistor MT belongs, FIG. 11 illustrates conductors CW divided for each string unit SU, differing from FIG. 8. FIG. 11 illustrates one layer as an example, as described above. However, the structure which will be described below with reference to FIG. 11 is also formed for another layer of the conductor CW.

As an example, FIG. 11 illustrates a case where a storage space of a string unit SU3 is used as the power-on-read area. Thus, the cell transistor MT in the string unit SU3 stores data to be read by power-on read. Specific descriptions are as follows. The string unit SU3 includes a plurality of cell transistors MT31, a plurality of cell transistors MT32, a plurality of cell transistors MT33, and a plurality of cell transistors MT34. The cell transistor MT31 is a cell transistor formed in the memory pillar MP3 connected to the conductor CBL(4p+1). The cell transistor MT32 is a cell transistor formed in the memory pillar MP4 connected to the conductor CBL(4p+2). The cell transistor MT33 is a cell transistor formed in the memory pillar MP11 connected to the conductor CBL(4p+3). The cell transistor MT34 is a cell transistor formed in the memory pillar MP12 connected to the conductor CBL(4p+4). The cell transistors MT31 to MT34 store valid data to be read by power-on read.

Transistors which are formed in the memory pillars MPW (W are natural numbers representing the string unit number) and connected to the conductors CBL(4p+1), CBL(4p+2), CBL(4p+3), and CBL(4p+4) are referred to as cell transistors MTW1, MTW2, MTW3, and MTW4 below, respectively.

The cell transistors MT31, MT32, MT33, and MT34 share a memory pillar belonging to a string unit SU different from the string unit SU3, which will be described below. It is assumed below that one of two cell transistors MT which are formed in the same memory pillar MP and belong to different string units SU is located on the back surface of the other. A first cell transistor MT among the two cell transistors MT located on the back surface of each other may be referred to as a backside cell transistor MT of a second cell transistor MT.

The cell transistor MT31 is located on the back surface of one cell transistor MT21. That is, the cell transistor MT21 belongs to a string unit SU2 which is different from the string unit SU3 of the cell transistor MT31 and is formed in the same memory pillar MP3 as that for the cell transistor MT31.

The cell transistor MT32 is located on the back surface of one cell transistor MT42. That is, the cell transistor MT42 belongs to a string unit SU4 which is different from the string unit SU3 of the cell transistor MT32 and is formed in the same memory pillar MP4 as that for the cell transistor MT32.

The cell transistor MT33 is located on the back surface of one cell transistor MT43. That is, the cell transistor MT43 belongs to the string unit SU4 which is different from the string unit SU3 of the cell transistor MT33 and is formed in the same memory pillar MP11 as that for the cell transistor MT33.

The cell transistor MT34 is located on the back surface of one cell transistor MT44. That is, the cell transistor MT44 belongs to the string unit SU4 which is different from the string unit SU3 of the cell transistor MT34 and is formed in the same memory pillar MP12 as that for the cell transistor MT34.

The cell transistors MT21, MT42, MT43, and MT44 do not store data. Instead, the cell transistors MT21, MT42, MT43, and MT44 are in a state of having a certain fixed threshold voltage. Such a state is a state where the cell transistors MT21, MT42, MT43, and MT44 have a threshold voltage higher than a voltage VSS. The cell transistors MT21, MT42, MT43, and MT44 may have a threshold voltage higher than a voltage which is applied to a word line WLeX when the read voltage VCGR is applied to a word line WLoX (X is 0 or a natural number) during reading, or a voltage which is applied to the word line WLoX when the read voltage VCGR is applied to the word line WLeX during reading. Specifically, the cell transistors MT21, MT42, MT43, and MT44 are in the Pr state. As described above, the cell transistors MT21, MT42, MT43, and MT44 are fixed in a specific state, and thus, as a result, are not used for storing data.

A cell transistor MT which is not located on the back surface of the cell transistor MT in the string unit SU3 among cell transistors MT in the string units SU2 and SU4 can be used for storing data. Specifically, the cell transistors MT other than the cell transistor MT21 among the cell transistors MT in the string unit SU2, that is, the cell transistors MT formed in the memory pillars MP2, MP9, and MP10 can be used for storing data. The cell transistor MT other than the cell transistors MT42, MT43, and MT44 among the cell transistors MT in the string unit SU4, that is, the cell transistor MT41 formed in the memory pillar MP4 can be used for storing data.

A cell transistor MT51 which is formed in the memory pillar MP5 and is connected to the conductor CBL1 will be described below in conjunction with another embodiment.

FIG. 12 is a table that illustrates locations of cell transistors that are free to store data or are not free to store data, as described above. In particular, the locations depicted in FIG. 12 are in the same layer as the power-on-read area 41 of the semiconductor memory 1 in the first embodiment. One cell of the table in FIG. 12 indicates the state of one cell transistor MT, which belongs to a string unit SU (SU2, SU3, or SU4) specified by a row. A string STR including the cell transistor MT in each cell is connected to the conductor CBL (CBL1, CBL2, CBL3, CBL4, ... ) specified by a column, and is connected to the bit line BL provided by such a conductor CBL. Each cell transistor MT in the string unit SU3 and its backside cell transistor MT are surrounded by a one-dot chain line.

As illustrated in FIG. 12, each cell transistor MT of the string unit SU3 is free to store data, which is to be read by power-on read (shown by hatching). A cell transistor MT located on the back surface of the cell transistor MT in the string unit SU3 has a threshold voltage having a value higher than the voltage VSS without storing data, and is in the Pr state. A cell transistor MT which is not located on the back surface of the cell transistor MT in the string unit SU3 can be used for storing data, that is, can be in the Er or Pr state in accordance with data.

As described with reference to FIGS. 11 and 12, the state of the cell transistor MT may be established by normal writing of each of the string units SU2, SU3, and SU4.

Figure 13:
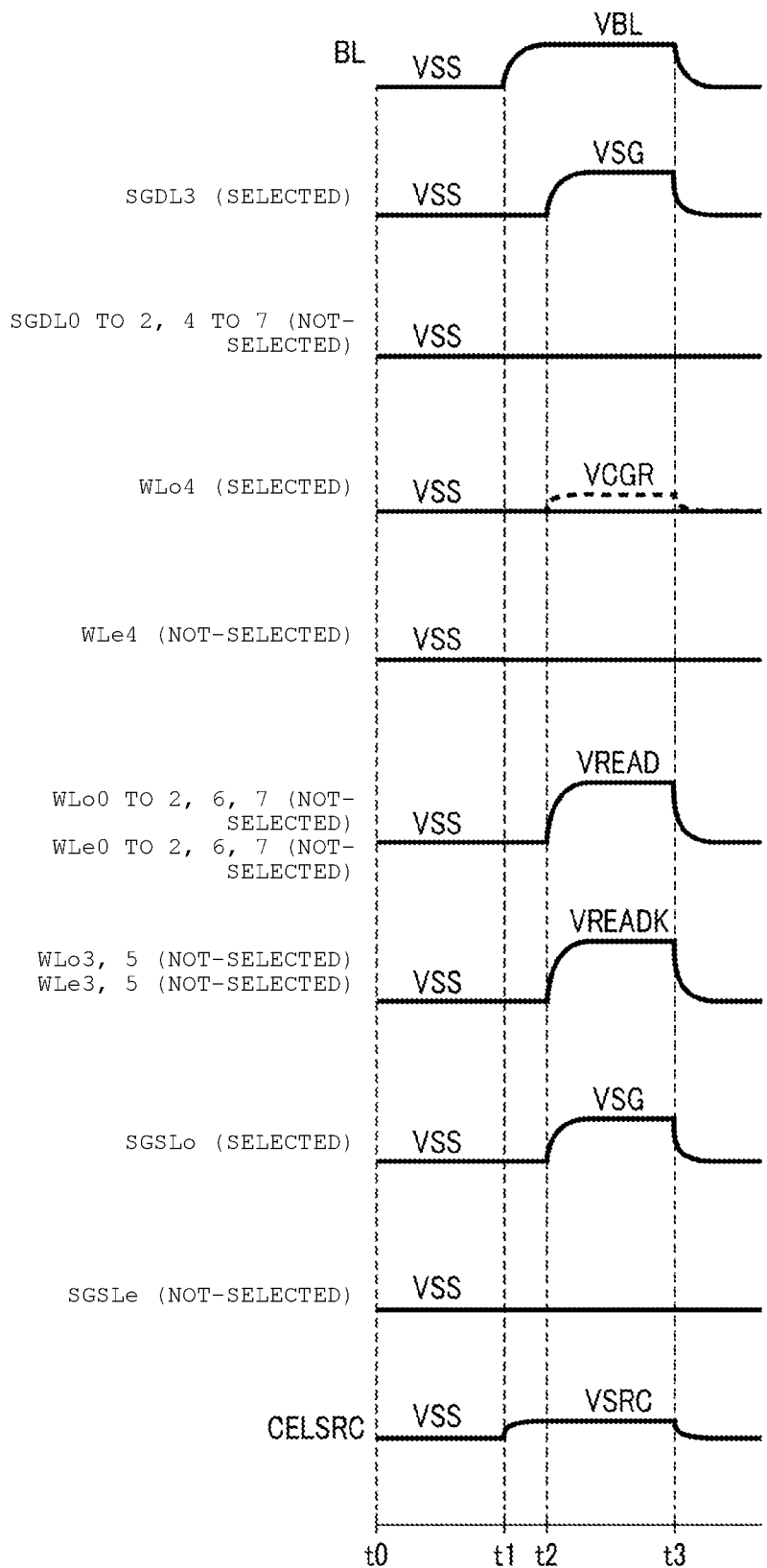
FIG. 13 is a timing diagram of voltages applied to various elements during an operation of the semiconductor memory of the first embodiment.

Next, reading will be described with reference to FIGS. 13 to 15. FIG. 13 is a timing diagram of voltages applied to various elements during an operation of the semiconductor memory 1 of the first embodiment. More specifically, FIG. 13 illustrates an operation on a selected block BLK in the power-on-read area 41. FIG. 13 illustrates voltages applied to various elements in reading from a cell unit CU connected to the word line WLo4 of the string unit SU3 in the selected block BLK, over time, as an example.

As illustrated in FIG. 13, the voltage VSS is applied to the bit line BL, all select gate lines SGDL0 to SGDL7, SGSLo, and SGSLe, and the cell source line CELSRC at the start of the operation in FIG. 13.

The bit line BL is pre-charged to a voltage VBL during a period from a time point t1 to a time point t3. A voltage VSRC is applied to the cell source line CELSRC during a period from the time point t1 to the time point t3. The voltage VSRC is slightly higher than the voltage VSS.

A voltage VSG is applied to the select gate line SGDL3 of the selected string unit SU3 and the select gate line SGSLo connected to the string unit SU3 from a time point t2. A read voltage VCGR is applied to the selected word line WLo4 from the time point t2. As described above, data is written in the cell transistor MT in the power-on-read area 41, in a binary manner, and a read voltage VL (=VSS) is applied to read from the cell transistor MT that stores binary data. A case where the read voltage VCGR is not the voltage VSS is denoted by a dotted line in order to illustrate a case which does not correspond to such an example, and to allow easy visual recognition of a period in which the read voltage VCGR is applied.

A voltage which is zero or positive is applied to the word line WLe4 which is formed on the same layer as that for the selected word line WLo4 and corresponds to the same value as "4" of the word line WLo4 at the location of X of the word line WLeX. The voltage is applied to the word line WLe4 from the time point t2, and this voltage is lower than the threshold voltage of the cell transistor MT21 (in particular, MT21_4 (where Y follows the underscore and indicates connection to the word line WLeY or WLoY) connected to the word line WLe4. Such a voltage is, for example, the voltage VSS. According to this example, the voltage VSS is applied to the word line WLe4 continuously from the time point t0 and the time point t2.

The voltage VREAD is applied to the word lines WL other than the total four word lines WLe3, WLe5, WLo3, and WLo5 which are adjacent to the word lines WLe4 and WLo4, among the remaining not-selected word lines WL, from the time point t2. That is, the voltage VREAD is applied to the word lines WLo0 to 2, WLo6, WLo7, WLe0 to 2, WLe6, and WLe7. The voltage VREAD is continuously applied until the time point t3.

A voltage VREADK is applied to the total four word lines WLe3, WLe5, WLo3, and WLo5 which are adjacent to the word lines WLe4 and WLo4, from the time point t2. The voltage VREADK is slightly higher than the voltage VREAD (for example, by 0.5 V). The voltage VREADK is continuously applied until the time point t3. The application of the voltage VREADK is optional, and instead, the voltage VREAD may be applied to the four word lines WLe3, WLe5, WLo3, and WLo5. In addition, the voltage VREADK may be applied to only one to three word lines WL among the four word lines WLe3, WLe5, WLo3, and WLo5, and the voltage VREAD may be applied to the remaining word line WL. In the following descriptions and drawings, as an example, the voltage VREADK is applied to the four word lines WLe3, WLe5, WLo3, and WLo5.

If the cell transistor MT connected to the selected word line WLo4 turns ON by applying such voltages, a current flows from the corresponding bit line BL to the cell source line CELSRC. If the cell transistor MT is in the OFF state, the current does not flow. Data to be stored by the cell transistor MT4 as a read target is determined by determining whether or not the current flows.

As described above, only a voltage which is lower than the threshold voltage of the cell transistor MT21_4 connected to the word line WLe4 is applied to the word line WLe4 during reading. Thus, an occurrence of a situation in which the cell transistor MT21_4 turns ON during a period of reading data from the cell transistor MT31_4 is prevented with high accuracy.

Figure 14:
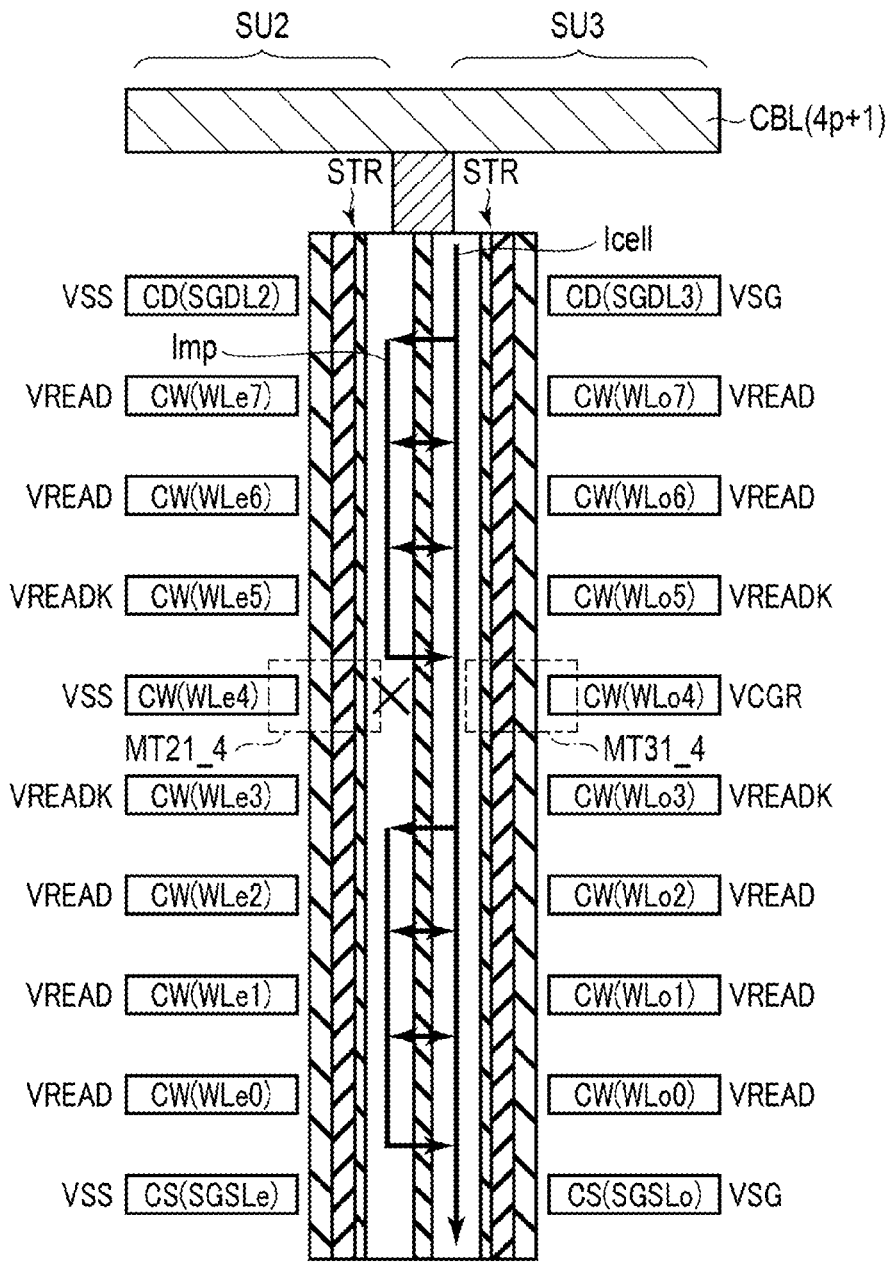
FIG. 14 illustrates a state of a part of the semiconductor memory of the first embodiment during an operation.
Figure 15:
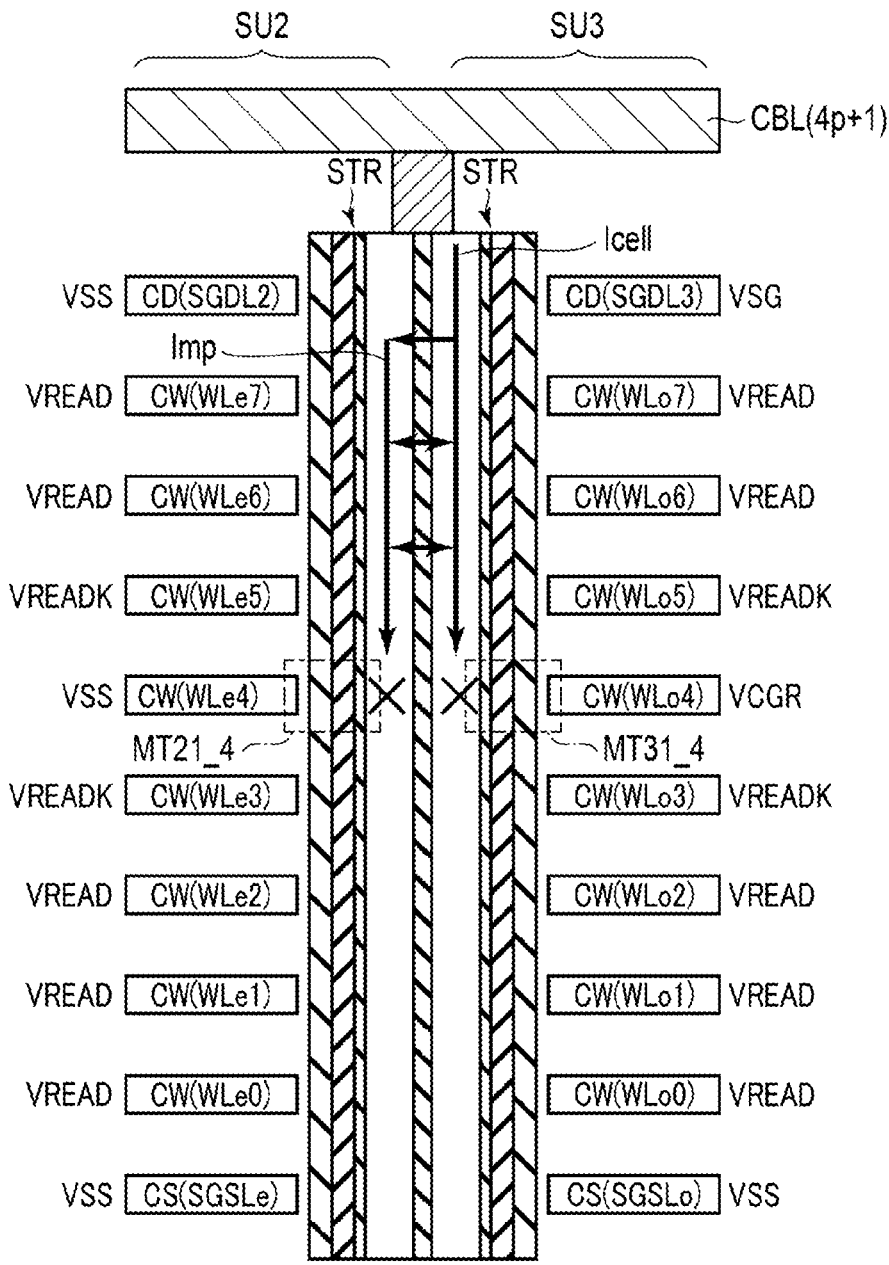
FIG. 15 illustrates another state of the part of the semiconductor memory of the first embodiment during the operation.

FIGS. 14 and 15 illustrate a state of a part of the semiconductor memory 1 during an operation. FIGS. 14 and 15 illustrate states of two strings STR which include two cell transistors MT (located on the back surface of each other) and are connected to the conductor CBL(4p+1) in the string units SU2 and SU3, in a period from the time point t2 to the time point t3 in FIG. 13. FIG. 14 illustrates a case where the cell transistor MT31_4 in the string unit SU3 has a threshold voltage lower than the read voltage VCGR. FIG. 15 illustrates a case where the cell transistor MT31_4 has a threshold voltage which is equal to or higher than the read voltage VCGR.

As illustrated in FIGS. 14 and 15, in the string STR of the string unit SU3, a cell current Icell flows (case in FIG. 14) or does not flow (case in FIG. 15) through the cell transistor MT31_4 based on the threshold voltage of the cell transistor MT31_4. Since the string STR in the string unit SU3 and the string STR in the string unit SU2 share the memory pillar MP, the cell current Icell flows into the string STR in the string unit SU2, and thus a current Imp may flow in the string STR in the string unit SU2. However, the cell transistor MT21_4 of the string STR in the string unit SU2 has a threshold voltage higher than the voltage VSS (for example, is in the Pr state), and the voltage VSS is applied to the word line WLe4. Therefore, the cell transistor MT21_4 is in the OFF state, and the current Imp does not flow through the cell transistor MT21_4. This prevents the current Imp from flowing in the cell transistor MT21_4 and having an influence on the determination of the state of the cell transistor MT31_4.

The states of the read target cell transistor MT31_4 in the string unit SU3 and the cell transistor MT21_4 in the string unit SU2 have been described with reference to FIGS. 14 and 15. The descriptions for such states are similarly applied to the states of the read target cell transistors MT32, MT33, and MT34 in the string unit SU3 and the states of the cell transistors MT42, MT43, and MT44 in the string unit SU4. Specifically, the symbols of "SU2", "SGDL2", "MT31_4", and "MT21_4" in FIGS. 14 and 15 and the related descriptions may be replaced with "SU4", "SGDL4", "MT32_4", and "MT42_4", respectively. In addition, in FIGS. 14 and 15 and the related descriptions, the symbols of "SU2", "SGDL2", "MT31_4", and "MT21_4" may be replaced with "SU4", "SGDL4", "MT33_4", and "MT43_4", respectively. In FIGS. 14 and 15 and the related descriptions, the symbols of "SU2", "SGDL2", "MT31_4", and "MT21_4" may be replaced with "SU4", "SGDL4", "MT34_4", and "MT44_4", respectively.

1.3. Advantages (Effects)

According to the semiconductor memory 1 in the first embodiment, it is possible to read data with the simpler configuration, as described below.

As in the semiconductor memory 1 illustrated in FIG. 5, in a case where two strings STR which respectively belong to different string units SU are formed in one memory pillar MP, it is considered that data is written and read in and from the cell transistor MT in the power-on-read area 41, in a binary manner, as follows. That is, data is independently written in the two strings STR, and thereby it is possible to store data having a volume larger than that in a case where one string STR is formed in one memory pillar MP. In a case where data is written in such a manner, data may be read in a manner as follows. As an example, similar to FIGS. 14 and 15, a case where data is read from the read target cell transistor MT31_4 connected to the word line WLo4 of the string unit SU3 is assumed. Differing from the first embodiment, the backside cell transistor MT21_4 of the read target cell transistor MT31_4 also stores data. Therefore, the cell transistor MT21_4 is in the Er or Pr state in accordance with data.

In such a state, when data is to be read from the cell transistor MT31_4, it is necessary that the cell transistor MT21_4 is in the OFF state such that the state of the cell transistor MT31_4 is correctly reflected in the data. Such a voltage is applied to the word line WL21_4 in order to cause the cell transistor MT21_4 to be reliably in the OFF state during a period of reading data from the cell transistor MT31_4. To achieve this, it is necessary that such a voltage be of a negative value to cause the cell transistor MT in the Er state to turn OFF. A special circuit is required for generating the negative voltage.

According to the memory system 5 in the first embodiment, the backside cell transistor MT of the read target cell transistor MT in the power-on-read area 41 receives a first voltage which is zero or positive and has been applied thereto during a period of reading from the read target cell transistor MT in the word line WL. In addition, the backside cell transistor MT has a threshold voltage higher than the first voltage. Therefore, it is not necessary for a negative read voltage VCGR to be applied to the word line WL of the backside cell transistor MT during the period of reading from the read target cell transistor MT in order to maintain the OFF state of the backside cell transistor MT of the read target cell transistor MT. Therefore, a circuit for generating the negative voltage is not required, and thus it is possible to simplify the semiconductor memory 1.

The power-on-read area 41 is an area read just after a supply of power to the semiconductor memory 1 starts. Important Information required for the subsequent operation of the semiconductor memory 1 is stored in the power-on-read area. Thus, high reliability for data read is required for the power-on-read area 41. However, since data in the power-on-read area 41 is read just after the supply of the power to the semiconductor memory 1 starts, the value of a parameter (for example, voltage to be applied) for reading may be not appropriate. For example, the value of the parameter for reading is determined based on the temperature of the semiconductor memory 1 in a case of normal reading. However, in a case of power-on read, such a control is not possible. In some cases, therefore, it is difficult to achieve high reliability of reading data from the power-on-read area 41, although that is required.

According to the semiconductor memory 1 in the first embodiment, as described above, the backside cell transistor MT of the read target cell transistor MT that stores data in the power-on-read area 41 has a threshold voltage higher than the first voltage. Therefore, the backside cell transistor MT of the read target cell transistor MT maintains the OFF state in reading from the read target cell transistor MT, with high accuracy, and is prevented from allowing a current to flow. Thus, it is possible to suppress an occurrence of interference by the backside cell transistor MT with determination of data (state) of the read target cell transistor MT so that data can be read from the read target cell transistor MT with high reliability.

Second Embodiment

A second embodiment is different from the first embodiment in that the state of the backside cell transistor MT of the read target cell transistor MT is different. Regarding the second embodiment, differences from the first embodiment will be described below. For points which are the same as those in the first embodiment, the descriptions of the first embodiment are applied to the second embodiment.

FIG. 16 is a table that illustrates locations of cell transistors in the same layer in the power-on-read area 41 of a semiconductor memory 1 according to the second embodiment. In FIG. 16, X0, X1, X2, X3, X4, X5, X6, X7, and X8 indicate specific states of the corresponding cell transistors MT, respectively. Specifically, X0, X1, X2, X3, X4, X5, X6, X7, and X8 indicate the Er or Pr state, according to an example of storing 1-bit data per cell transistor.

As illustrated in FIG. 16, two cell transistors MT located on the back surface of each other are in the same state. That is, each cell transistor MT in the string unit SU3 is in the Er or Pr state in accordance with data to be stored. The backside cell transistor MT of the cell transistor MT in the string unit SU3 among the cell transistors MT in the string units SU2 and SU4 does not store data and is in the same state as that of the corresponding backside cell transistor MT in the string unit SU3. The cell transistor MT which is not located on the back surface of the cell transistor MT in the string unit SU3 among the cell transistors MT in the string units SU2 and SU4, for example, the cell transistor MT connected to the conductor CBL(4p+1) of the string unit SU4, and the cell transistor MT connected to the conductor CBL(4p+2), CBL(4p+3), or CBL(4p+4) of the string unit SU2 can be used for storing data, and thus can be in the state in accordance with data stored therein.

A voltage is applied to each wiring in the same manner as that in the first embodiment (FIG. 13). That is, voltages applied to various elements during a period of reading from the cell unit CU connected to the word line WLo4 of the string unit SU3 of the selected block BLK in the power-on-read area 41 are the same as those in FIG. 13.

Figure 17:
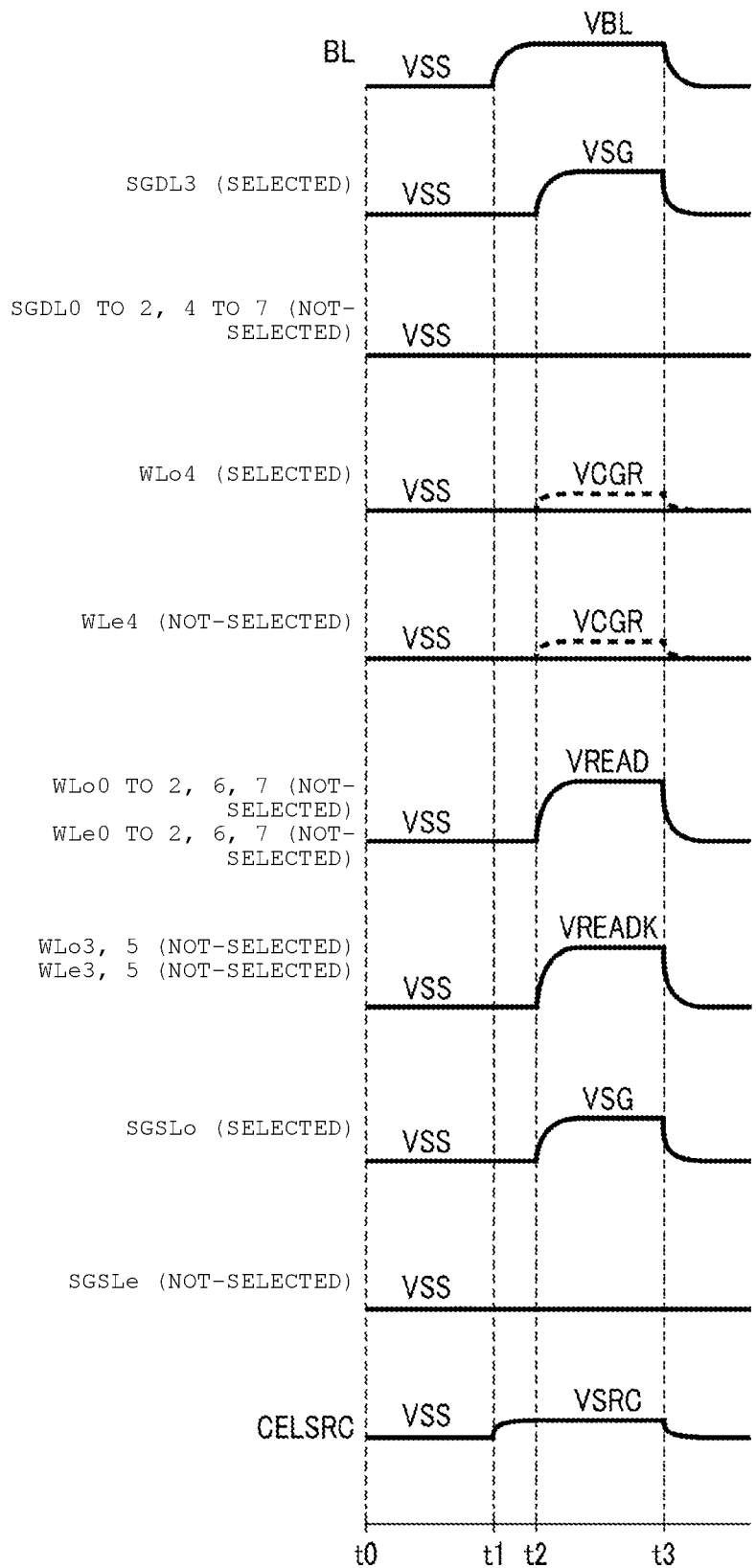
FIG. 17 is a timing diagram of voltages applied to various elements during an operation of the semiconductor memory of the second embodiment.

As illustrated in FIG. 17, the read voltage VCGR is applied to the word line WLe4 which is formed on the same layer as that for the word line WLo4 and corresponds to the same value as "4" of the word line WLo4 at the location of X of the word line WLoX, during a period from a time point 2 to a time point t3, similar to the word line WLo4.

Since the voltages as described above are applied, the selected state is formed in the backside cell transistors MT21_4, MT42_4, MT43_4, and MT44_4 of the cell transistors MT31_4, MT32_4, MT33_4, and MT34_4 in addition to the cell transistors MT31_4, MT32_4, MT33_4, and MT34_4 in the string unit SU3.

As described above, data to be stored in the cell transistor MT31_4 is stored in the cell transistors MT31_4 and the MT21_4 located on the back surface of each other. In addition, data to be stored in the cell transistor MT32_4 is stored in the cell transistors MT32_4 and the MT42_4 located on the back surface of each other. In addition, data to be stored in the cell transistor MT33_4 is stored in the cell transistors MT33_4 and the MT43_4 located on the back surface of each other. In addition, data to be stored in the cell transistor MT34_4 is stored in the cell transistors MT34_4 and the MT44_4 located on the back surface of each other.

If the cell transistors MT31_4 and MT21_4 located on the back surface of each other turn ON, a current flows from the corresponding bit line BL to the cell source line CELSRC. If the cell transistors MT31_4 and MT21_4 are in the OFF state, the current does not flow. Data to be stored in the read target cell transistor MT31_4 is determined by determining whether or not the current flows.

Similarly, if the cell transistors MT32_4 and MT42_4 located on the back surface of each other turn ON, a current flows from the corresponding bit line BL to the cell source line CELSRC. If the cell transistors MT32_4 and MT42_4 are in the OFF state, the current does not flow. In addition, if the cell transistors MT33_4 and MT43_4 located on the back surface of each other turn ON, a current flows from the corresponding bit line BL to the cell source line CELSRC. If the cell transistors MT33_4 and MT43_4 are in the OFF state, the current does not flow. If the cell transistors MT34_4 and MT44_4 located on the back surface of each other turn ON, a current flows from the corresponding bit line BL to the cell source line CELSRC. If the cell transistors MT34_4 and MT44_4 are in the OFF state, the current does not flow.

Figure 18:
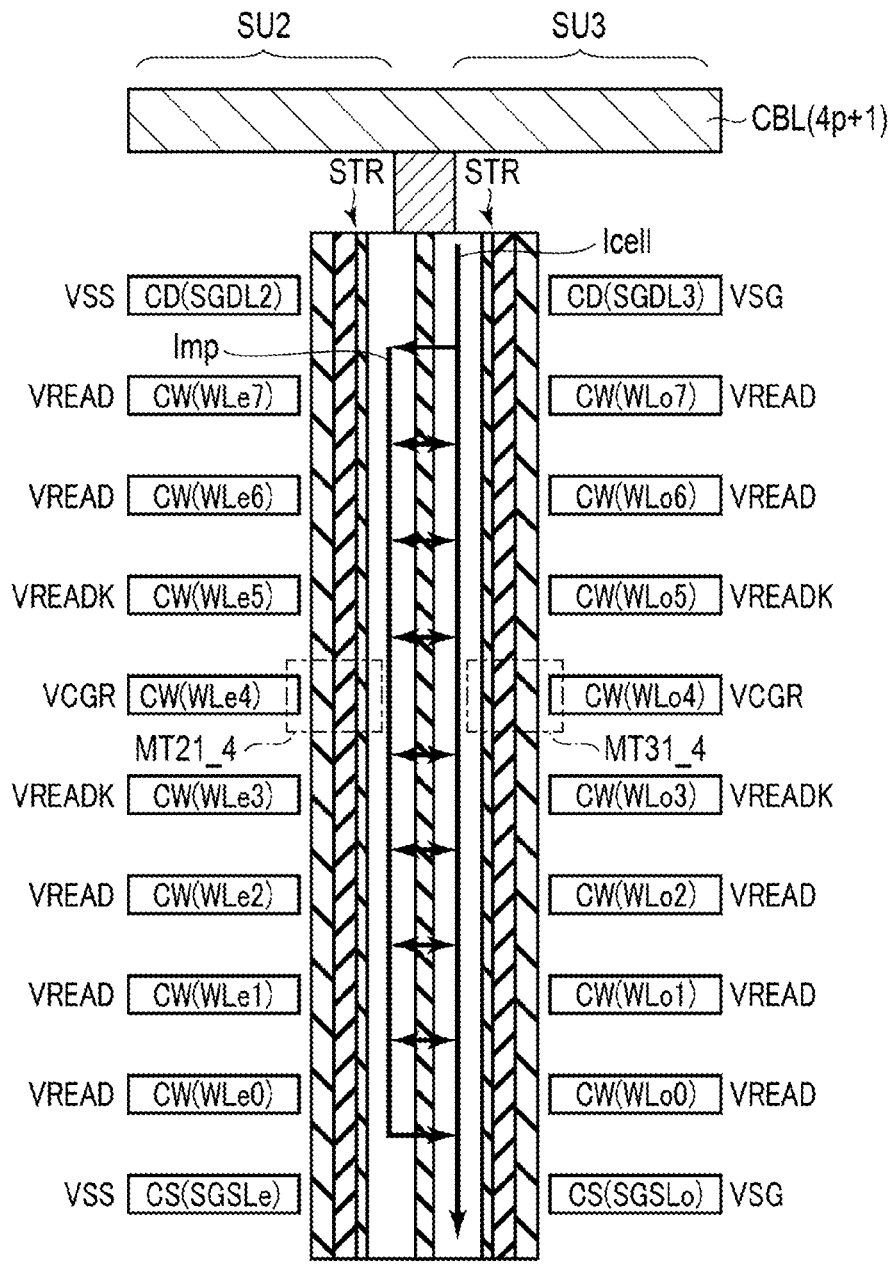
FIG. 18 illustrates a state of a part of the semiconductor memory of the second embodiment during an operation.
Figure 19:
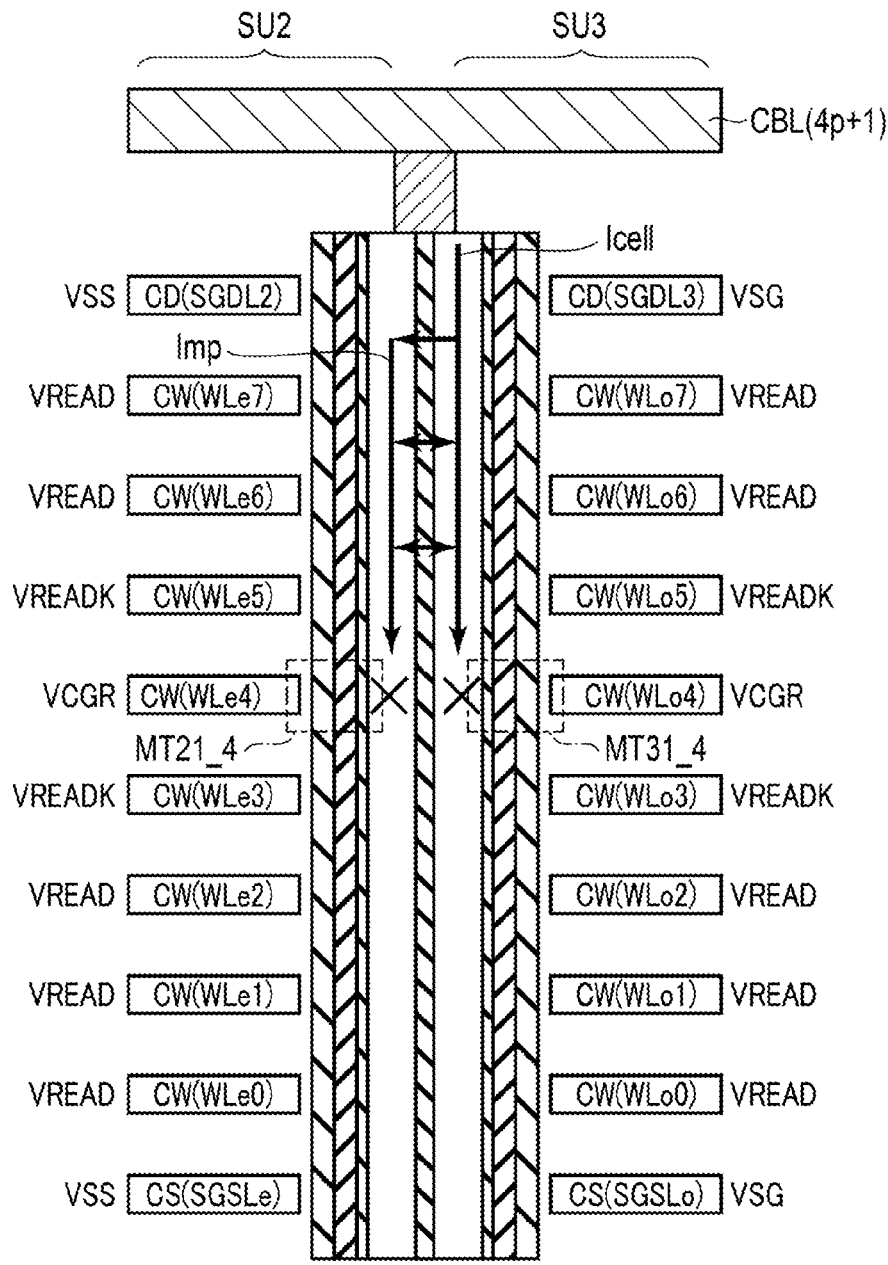
FIG. 19 illustrates another state of the part of the semiconductor memory of the second embodiment during the operation.

FIGS. 18 and 19 illustrate a state of a part of the semiconductor memory 1 during an operation, in the second embodiment. FIGS. 18 and 19 illustrate states of two strings STR which include two cell transistors MT (located on the back surface of each other) and are connected to the conductor CBL(4p+1) in the string units SU2 and SU3, in a period from the time point t2 to the time point t3 in FIG. 17. FIG. 18 illustrates a case where the cell transistor MT31_4 in the string unit SU3 has a threshold voltage which is equal to or lower than the read voltage VCGR. FIG. 19 illustrates a case where the cell transistor MT31_4 has a threshold voltage which is higher than the read voltage VCGR.

As illustrated in FIGS. 18 and 19, in the string STR of the string unit SU3, a cell current Icell flows (case in FIG. 18) or does not flow (case in FIG. 19) based on the threshold voltage of the cell transistor MT31_4. At this time, in the string unit SU2, the cell transistor MT21_4 stores the same data as that in the cell transistor MT31_4, and the read voltage VCGR is applied to the word line WLe4 along with the word line WLo4. Therefore, as illustrated in FIG. 18, if the cell transistor MT31_4 turns ON by applying the read voltage VCGR, the cell transistor MT21_4 also turns ON, and thus a current Imp flows in the cell transistor MT21_4. As illustrated in FIG. 19, if the cell transistor MT31_4 maintains the OFF state even though the read voltage VCGR is applied, the cell transistor MT21_4 also maintains the OFF state. Thus, an occurrence of a situation in which the state of the cell transistor MT21_4 influences the cell current Icell is avoided. In addition, the cell transistor MT21_4 assists the cell current Icell, that is, amplifies a difference of the value of the cell current Icell between a case where the cell current Icell does not flow (the cell current Icell is zero) and a case where the cell current Icell flows.

The states of the read target cell transistor MT31_4 and the cell transistor MT21_4 have been described with reference to FIGS. 18 and 19. The descriptions for such states are similarly applied to the states of the read target cell transistors MT32, MT33, and MT34 in the string unit SU3 and the states of the cell transistors MT42, MT43, and MT44 in the string unit SU4, as described in the first embodiment with reference to FIGS. 14 and 15. Specifically, the symbols of "SU2", "SGDL2", "MT31_4", and "MT21_4" in FIGS. 18 and 19 may be replaced with "SU4", "SGDL4", "MT32_4", and "MT42_4", respectively. The symbols of "SU2", "SGDL2", "MT31_4", and "MT21_4" in FIGS. 18 and 19 may be replaced with "SU4", "SGDL4", "MT33_4", and "MT43_4", respectively. The symbols of "SU2", "SGDL2", "MT31_4", and "MT21_4" in FIGS. 18 and 19 may be replaced with "SU4", "SGDL4", "MT34_4", and "MT44_4", respectively.

According to the semiconductor memory 1 in the second embodiment, the backside cell transistor MT of the read target cell transistor MT that stores data in the power-on-read area 41 stores the same data as that in the read target cell transistor MT (is in the same state), and is placed in a state selected during the period of reading from the read target cell transistor MT. Therefore, if the read target cell transistor MT turns ON, the backside cell transistor MT of the read target cell transistor MT also turns ON. If the read target cell transistor MT maintains the OFF state, the backside cell transistor MT of the read target cell transistor MT also maintains the OFF state. Thus, the occurrence of a situation in which the state of the backside cell transistor MT of the read target cell transistor MT influences the cell current Icell is avoided. In addition, the backside cell transistor MT of the read target cell transistor MT assists the cell current Icell. Therefore, it is possible to read data from the read target cell transistor MT with high reliability.

Third Embodiment

A third embodiment may be additionally implemented in the first embodiment.

As with data stored in the power-on-read area 41, important data and/or data read in an unstable state may be written in duplicate in each cell unit CU of a plurality of string units SU and may read by selecting a plurality of cell units CU in parallel. Such storage and reading of data are referred to as multiple selection below. The third embodiment has a form in which multiple selection is applied to the first embodiment.

Figure 20:
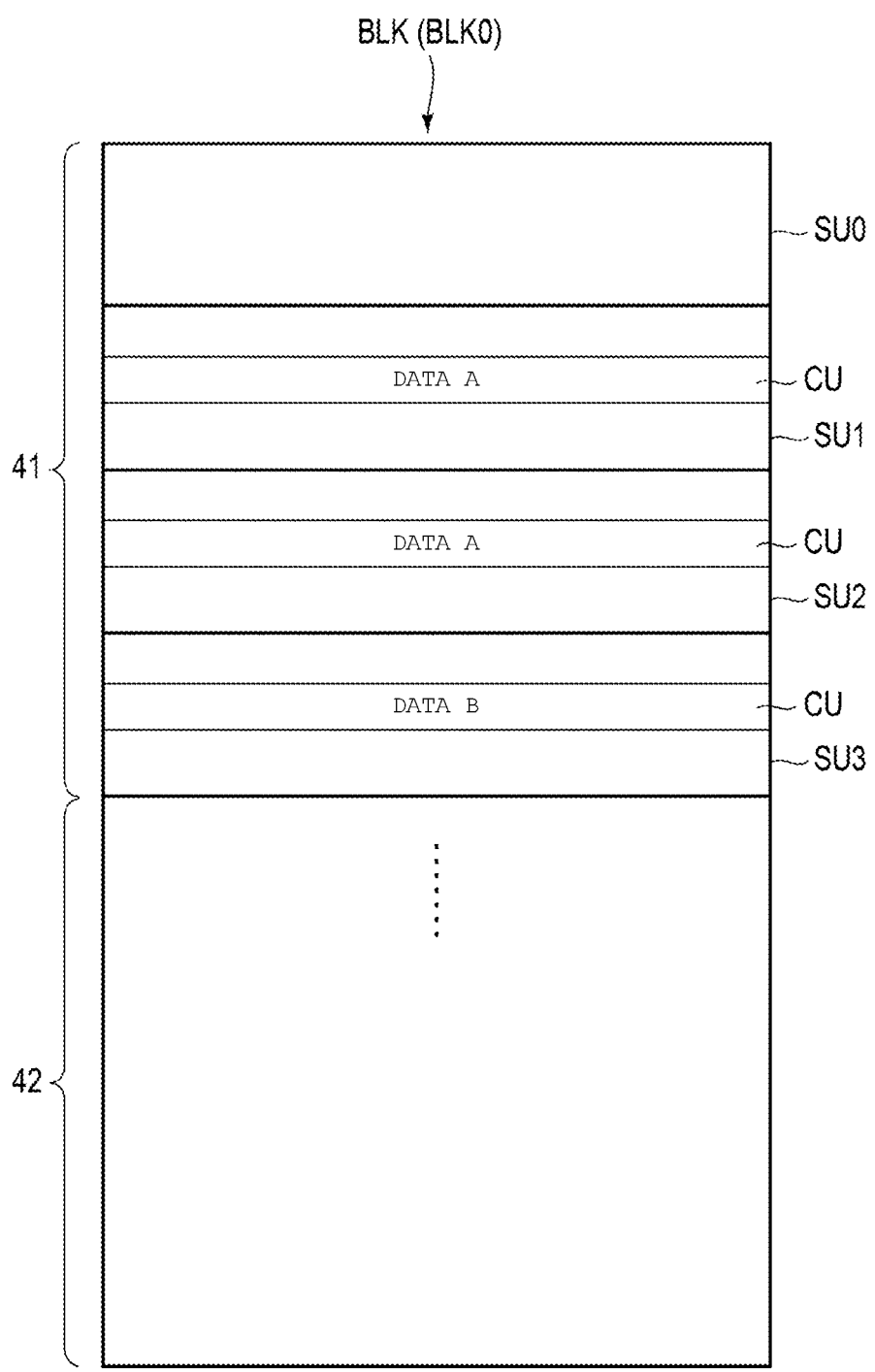
FIG. 20 schematically illustrates a block of a semiconductor memory according to a third embodiment.

FIG. 20 illustrates an example of using a block BLK in a semiconductor memory 1 in the third embodiment. As illustrated in FIG. 20, for example, the block BLK0 includes the power-on-read area 41. At least total two cell units CU in at least two string units SU of the power-on-read area 41, for example, the string units SU1 and SU2 store the same data A, that is, are multiple-selected. In a case where the cell unit CU subjected to multiple selection stores 1-bit data per cell transistor MT, pages of these cell units CU store the same data. In a case where the cell unit CU subjected to multiple selection stores 2-bit data per cell transistor MT, the upper pages of these cell units CU store the same data, and the lower pages of these cell units CU store the same data. As depicted representatively as the cell unit CU of the string unit SU3, the cell units CU of other string units SU store data different from data in the cell units CU of the string units SU1 and SU3.

FIG. 21 illustrates storage of data in some cell transistors MT located in the same layer in the power-on-read area 41 in the semiconductor memory 1 according to the third embodiment. FIG. 21 is made based on an example in which the string unit SU3 and a string unit SU having an address of the string unit SU3, that is, an address of an odd number like "3" are multiple-selected. As a specific example, an example in which the string units SU3 and SU5 are multiple-selected, that is, store the same data is illustrated. In FIG. 21, cells indicating cell transistors MT in the string units SU3 and SU5, which are multiple-selected are subjected to hatching.

As illustrated in FIG. 21, in the string units SU3 and SU5, two cell transistors MT connected to the same bit line BL are in the same state.

In addition, specific cell transistors MT in the string units SU4 and SU6 aligned with the string unit SU5 are located on the back surfaces of the cell transistors MT in the string unit SU5. Specific descriptions are as follows.

A cell transistor MT connected to the conductor CBL(p+1) in the string unit SU5 is located on the back surface of a cell transistor MT connected to the conductor CBL(p+1) in the string unit SU4. A cell transistor MT connected to the conductor CBL(p+2) in the string unit SU5 is located on the back surface of a cell transistor MT connected to the conductor CBL(p+2) in the string unit SU6. A cell transistor MT connected to the conductor CBL(p+3) in the string unit SU5 is located on the back surface of a cell transistor MT connected to the conductor CBL(p+3) in the string unit SU6. A cell transistor MT connected to the conductor CBL(p+4) in the string unit SU5 is located on the back surface of a cell transistor MT connected to the conductor CBL(p+4) in the string unit SU6.

Similar to the first embodiment, the backside cell transistors MT of the cell transistors MT in the string units SU3 and SU5 can have a threshold voltage which is higher than a voltage applied to the word line WLeX when the read voltage VCGR is applied to the word line WLoX in reading or a voltage applied to the word line WLoX when the read voltage VCGR is applied to the word line WLeX in reading. As an example, the backside cell transistor MT may be in the Pr state.

A cell transistor MT which is not located on the back surface of the cell transistor MT in the string unit SU3 or SU5 among cell transistors MT in the string units SU2 and SU6 can be used for storing data. Specifically, the cell transistor MT connected to the conductor CBL(p+2), CBL(p+3), or CBL(p+4) among the cell transistors MT of the string unit SU2 can be used for storing data. The cell transistor MT connected to the conductor CBL(p+1) among the cell transistors MT of the string unit SU6 can be used for storing data.

Figure 22:
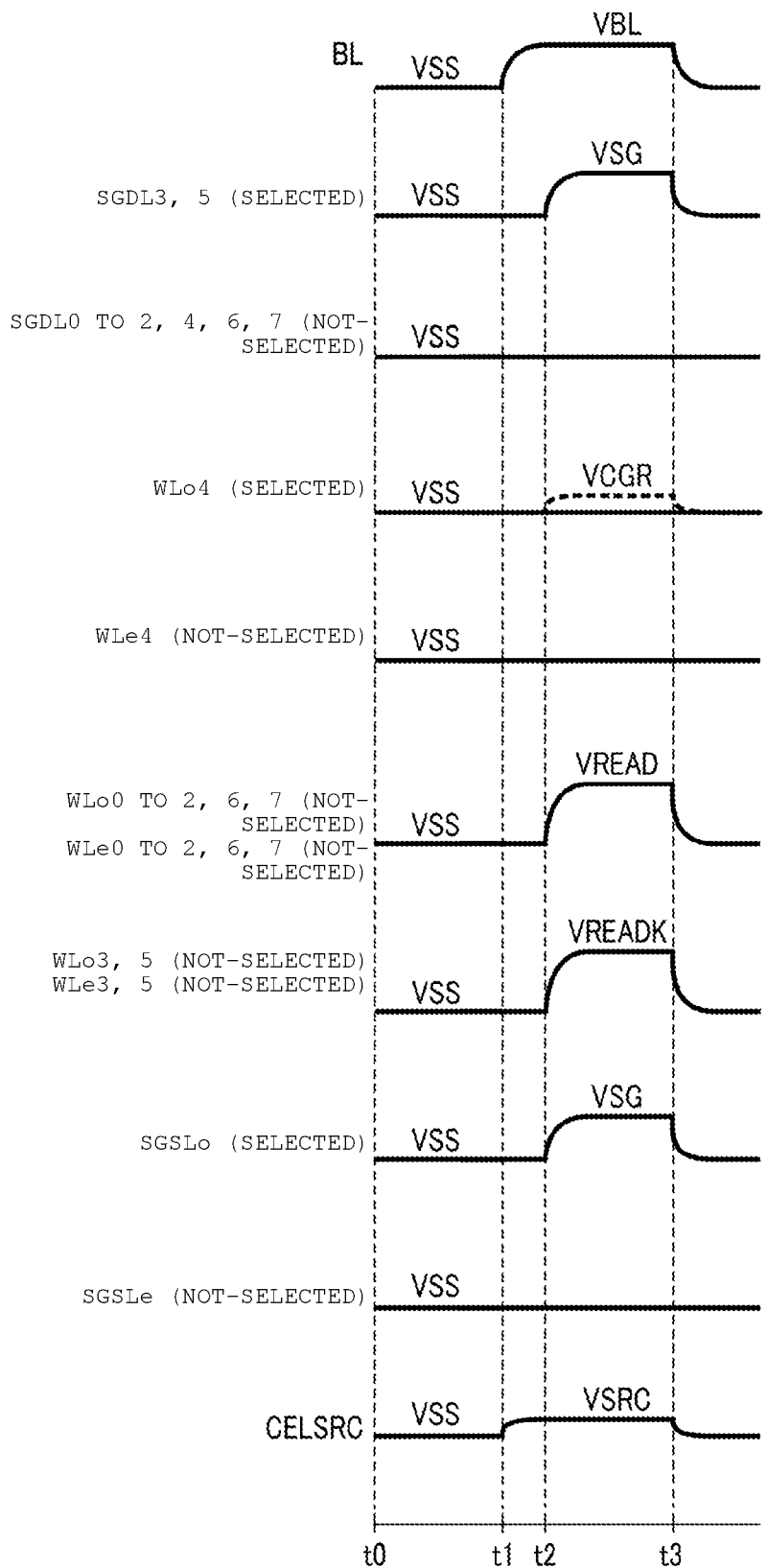
FIG. 22 is a timing diagram of voltages applied to various elements during an operation of the semiconductor memory of the third embodiment.

FIG. 22 is a timing diagram of voltages applied to various elements during an operation of the semiconductor memory 1 of the third embodiment. More specifically, FIG. 22 illustrates an operation on a selected block BLK in the power-on-read area 41. FIG. 22 illustrates voltages applied to various elements in reading from the cell unit CU connected to the word line WLo4 in a state where the string units SU3 and SU5 in the selected block BLK are multiple-selected, over time, as an example. Descriptions will be made below focusing on points different from those in the first embodiment (FIG. 13).

As illustrated in FIG. 22, the voltage VSG is applied to the select gate lines SGDL3 and SGDL5 for the string units SU3 and SU5 which are multiple-selected, during a period from a time point t2 to a time point t3. With such an application of the voltage, the string STR in the string unit SU3 and the string STR in the string unit SU5 are electrically connected to each other between the bit line BL and the cell source line CELSRC.

The states of the strings STR in the selected string units SU3 and SU5 and the state of the string STR to which the backside cell transistor MT of the cell transistor MT as the read target belongs are identical to those in the first embodiment (FIGS. 14 and 15). That is, the states of each string STR in the string units SU2 and SU3 in FIGS. 14 and 15 and the related descriptions occur in each string STR of two string units SU including two cell transistors MT located on the back surface of each other among the string units SU2, SU3, SU4, SU5, and SU6.

According to the third embodiment, similar to the first embodiment, the backside cell transistor MT of the read target cell transistor MT that stores data in the power-on-read area 41 is in a state (for example, the Pr state) of having a high threshold voltage which is not used for storing data. Therefore, the same advantages as those in the first embodiment are obtained.

Further, according to the third embodiment, the same data is stored in two cell units CU in the power-on-read area 41, and thus data is read from the two cell units CU. Therefore, even if a failure occurs in one cell unit CU, data can be read from the other cell unit CU, and thus it is possible to read data by power-on read with high reliability, as a whole. Even in any of two cell units CU which are multiple-selected, the backside cell transistor MT of the cell transistor MT in such a cell unit CU is in a state of having a high threshold voltage which is not used for storing data. Therefore, it is possible to read data from the read target cell transistor MT with higher reliability.

Fourth Embodiment

A fourth embodiment has a form in which multiple selection is applied to the second embodiment.

FIG. 23 illustrates storage of data by some cell transistors MT located in the same layer in the power-on-read area 41 in a semiconductor memory 1 according to the fourth embodiment. As illustrated in FIG. 23, similar to the third embodiment, at least two cell units CU of the power-on-read area 41 store the same data. For example, two cell transistors MT connected to the same bit line BL, in the string units SU3 and SU5, are in the same state.

In addition, similar to the second embodiment, the backside cell transistor MT of each read target cell transistor MT in the string units SU3 and SU5 is in the same state as that of the read target cell transistor MT.

A cell transistor MT which is not located on the back surface of the cell transistor MT in the string unit SU3 or SU5 among the cell transistors MT in the string units SU2 and SU6 can be used for storing data, that is, can be in the state in accordance with data. Specifically, the cell transistor MT connected to the conductor CBL(4p+1) among the cell transistors MT in the string unit SU6 and the cell transistor MT connected to the conductor CBL(4p+2), CBL(4p+3), or CBL(4p+4) among the cell transistors MT in the string unit SU2 can be used for storing data.

Figure 24:
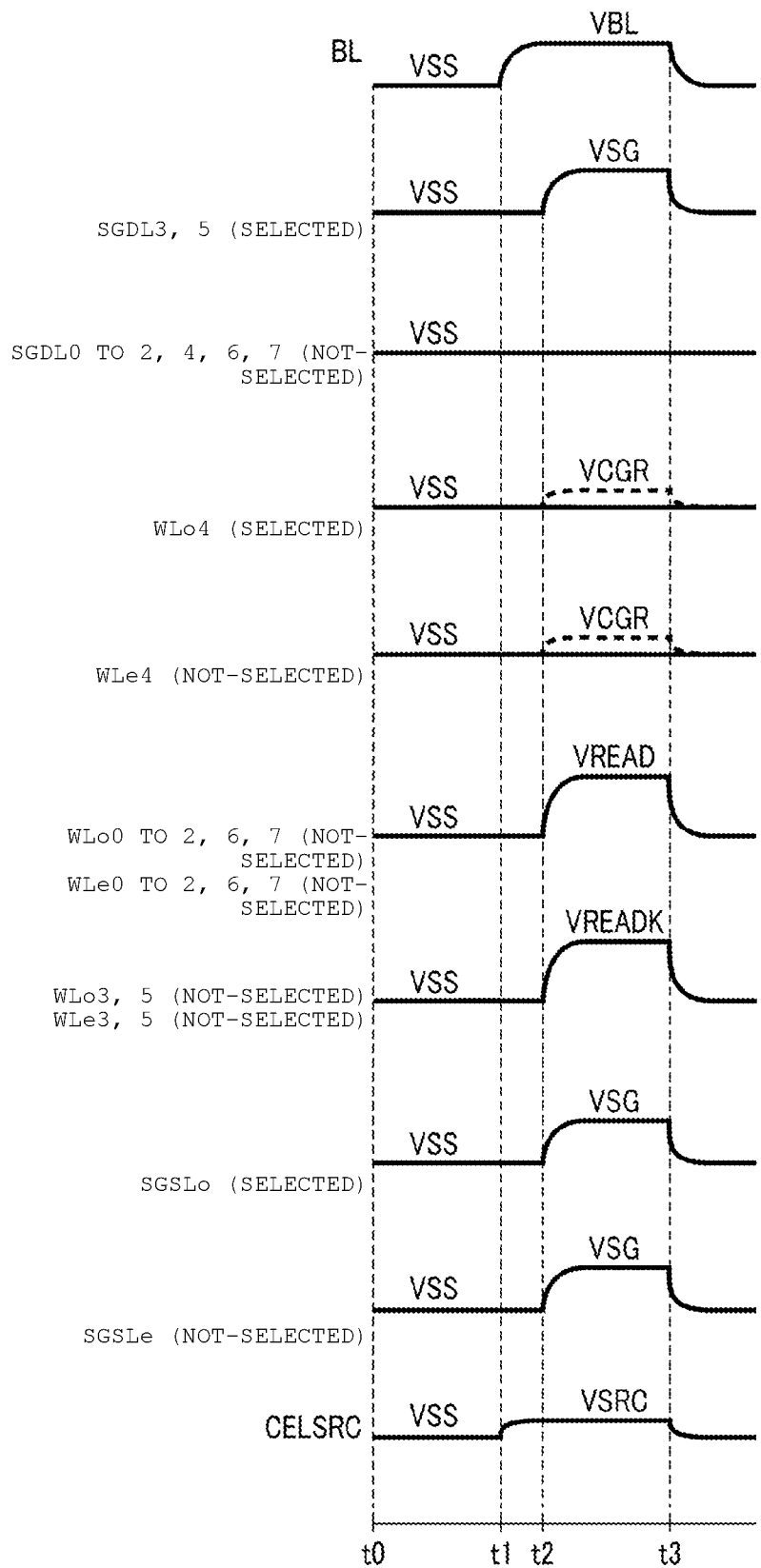
FIG. 24 is a timing diagram of voltages applied to various elements during an operation of the semiconductor memory of the fourth embodiment.

FIG. 24 is a timing diagram of voltages applied to various elements during an operation of the semiconductor memory 1 of the fourth embodiment. More specifically, FIG. 24 illustrates an operation on a selected block BLK in the power-on-read area 41. FIG. 24 illustrates voltages applied to various elements in reading from the cell unit CU connected to the word line WLo4 in a state where the string units SU3 and SU5 in the selected block BLK are multiple-selected, over time, as an example. Descriptions will be made below focusing on points different from those in the second embodiment (FIG. 17).

As illustrated in FIG. 24, the voltage VSG is applied to the select gate lines SGDL3 and SGDL5 for the string units SU3 and SU5 which are multiple-selected, during a period from a time point t2 to a time point t3. With such an application of the voltage, the string STR in the string unit SU3 and the string STR in the string unit SU5 are electrically connected to each other between the bit line BL and the cell source line CELSRC.

The states of the strings STR in the selected string units SU3 and SU5 and the state of the string STR to which the backside cell transistor MT of the cell transistor MT as the read target belongs are identical to those in the second embodiment (FIGS. 18 and 19). That is, the states of each string STR in the string units SU2 and SU3 in FIGS. 18 and 19 and the related descriptions occur in each string STR of two string units SU including two cell transistors MT located on the back surface of each other among the string units SU2, SU3, SU4, SU5, and SU6.

According to the fourth embodiment, similar to the second embodiment, the backside cell transistor MT of the read target cell transistor MT that stores data in the power-on-read area 41 stores the same data as that in the read target cell transistor MT, and is in a state of having been selected during a period of reading from the read target cell transistor MT. Therefore, the same advantages as those in the second embodiment are obtained.

Further, according to the fourth embodiment, similar to the third embodiment, the same data is stored in two cell units CU in the power-on-read area 41, and data is read from the two cell units CU. Therefore, it is possible to read data from the read target cell transistor MT with higher reliability.

Fifth Embodiment

A fifth embodiment has a form in which multiple selection is applied to the first embodiment in a manner different from that in the third embodiment.

FIG. 25 illustrates storage of data by some cell transistors MT located in the same layer in the power-on-read area 41 in a semiconductor memory 1 according to the fifth embodiment. As illustrated in FIG. 25, similar to the third embodiment, at least two cell units CU of the power-on-read area 41 store the same data. Differing from the third embodiment, two string units SU having addresses adjacent to each other, for example, the string units SU3 and SU4 store the same data. That is, two cell transistors MT connected to the same conductor CBL in the string units SU3 and SU4, are in the same state.

The two cell transistors MT connected to the same conductor CBL(4p+1) in the string units SU3 and SU4 which are multiple-selected, are not located on the back surface of each other. Therefore, a cell transistor MT which is located on the back surface of the cell transistor MT connected to the conductor CBL(4p+1) of the string unit SU3 and is connected to the conductor CBL(4p+1) of the string unit SU2 is not used for storing data. Instead, the backside cell transistor MT has a threshold voltage which is high enough for not turning ON even though the read voltage VCGR is applied to the word line WL. For example, the backside cell transistor MT is in the Pr state.

Similarly, a cell transistor MT which is located on the back surface of the cell transistor MT41 connected to the conductor CBL(4p+1) of the string unit SU4 and is connected to the conductor CBL(4p+1) of the string unit SU5 is not used for storing data. Instead, the backside cell transistor MT has a threshold voltage which is high enough for not turning ON even though the read voltage VCGR is applied to the word line WL. For example, the backside cell transistor MT is in the Pr state.

A cell transistor MT which is not located on the back surface of the cell transistor MT in the string unit SU3 or SU4 among the cell transistors MT in the string units SU2 and SU5 can be used for storing data. Specifically, the cell transistor MT connected to the conductor CBL(4p+2), CBL(4p+3), or CBL(4p+4) among the cell transistors MT of the string unit SU2 or SU5 can be used for storing data.

Figure 26:
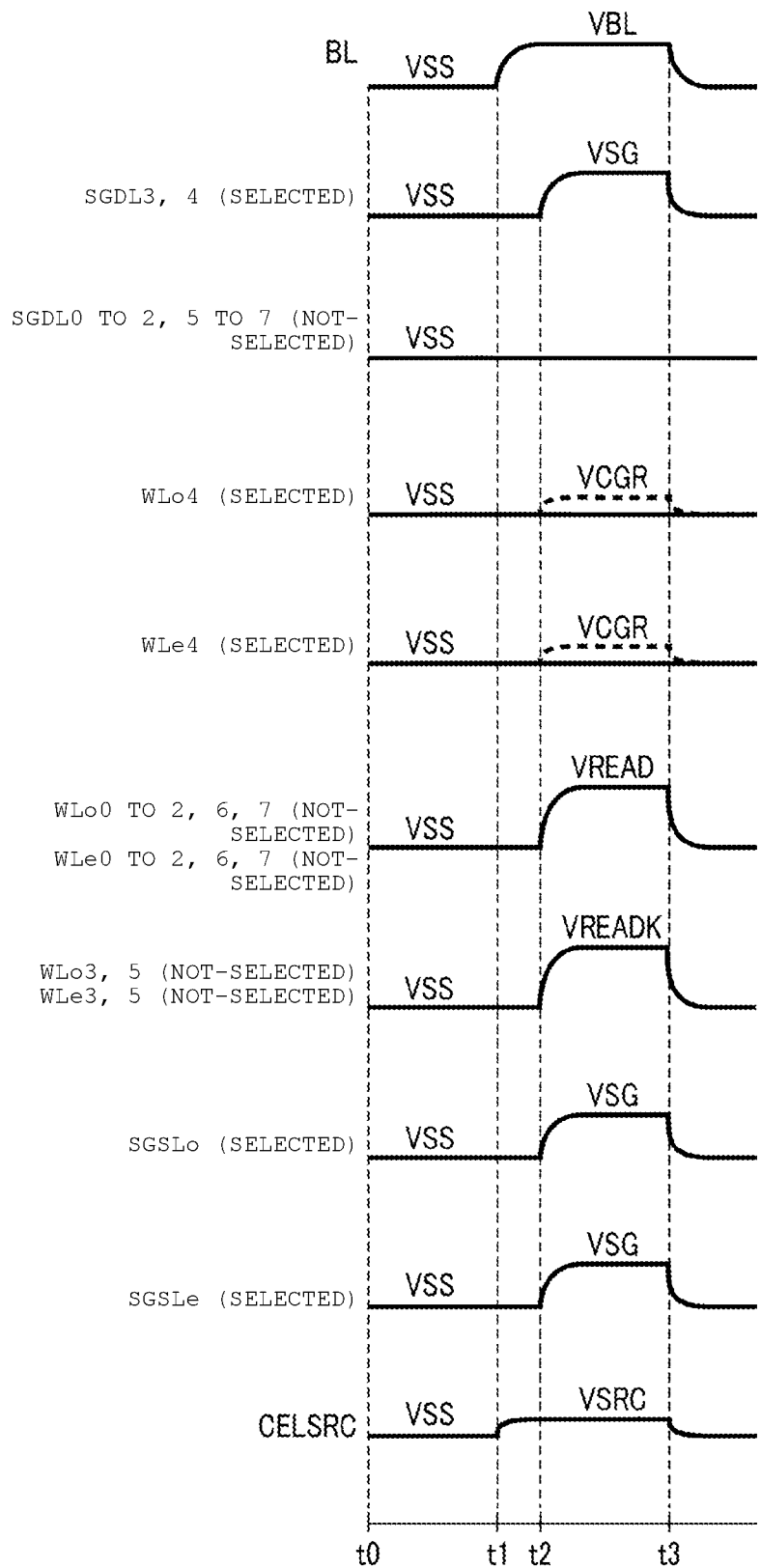
FIG. 26 is a timing diagram of voltages applied to various elements during an operation of the semiconductor memory of the fifth embodiment.

FIG. 26 is a timing diagram of voltages applied to various elements during an operation of the semiconductor memory 1 of the fifth embodiment. More specifically, FIG. 26 illustrates an operation on a selected block BLK in the power-on-read area 41. FIG. 26 illustrates voltages applied to various elements in reading from the cell unit CU connected to the word line WLo4 in a state where the string units SU3 and SU4 in the selected block BLK are multiple-selected, over time, as an example. Descriptions will be made below focusing on points different from those in the first embodiment (FIG. 13).

As illustrated in FIG. 26, the voltage VSG is applied to the select gate lines SGDL3 and SGDL4 for the string units SU3 and SU4 which are multiple-selected, during a period from a time point t2 to a time point t3. The voltage VSG is applied to the select gate lines SGSLo and SGSLe during a period from a time point t2 to a time point t3. With such an application of the voltage, the string STR in the string unit SU3 and the string STR in the string unit SU4 are electrically connected to each other between the bit line BL and the cell source line CELSRC.

The read voltage VCGR is applied to the word lines WLo4 and WLe4 during a period of time points t2 to t3. With such an application of the voltage, it is determined whether or not the cell current Icell flows in the cell transistors MT31_4 and MT41_4, based on data in the cell transistors MT31_4 and MT41_4. Thus, it is possible to determine the states of the cell transistors MT31_4 and MT41_4.

Figure 27:
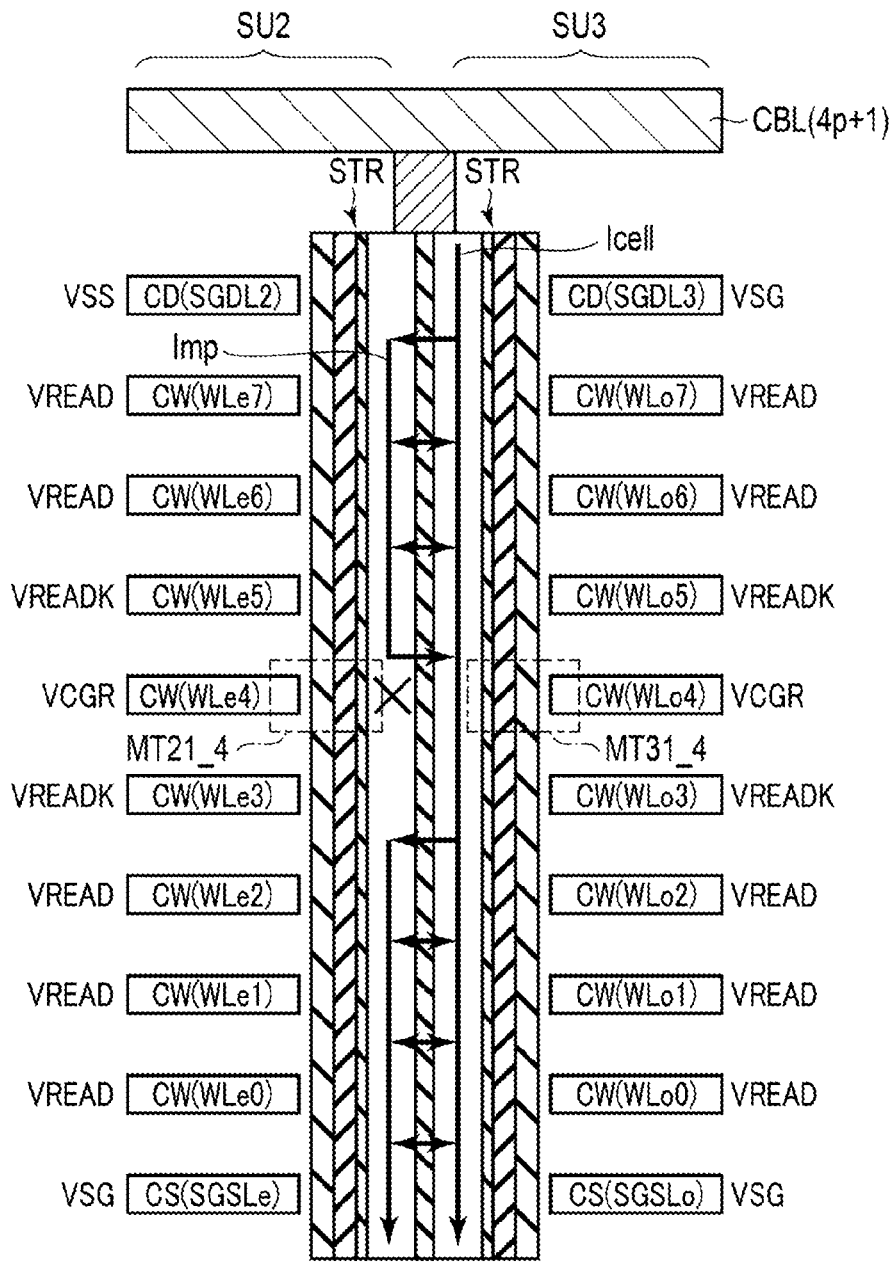
FIG. 27 illustrates a state of a part of the semiconductor memory of the fifth embodiment during an operation.
Figure 28:
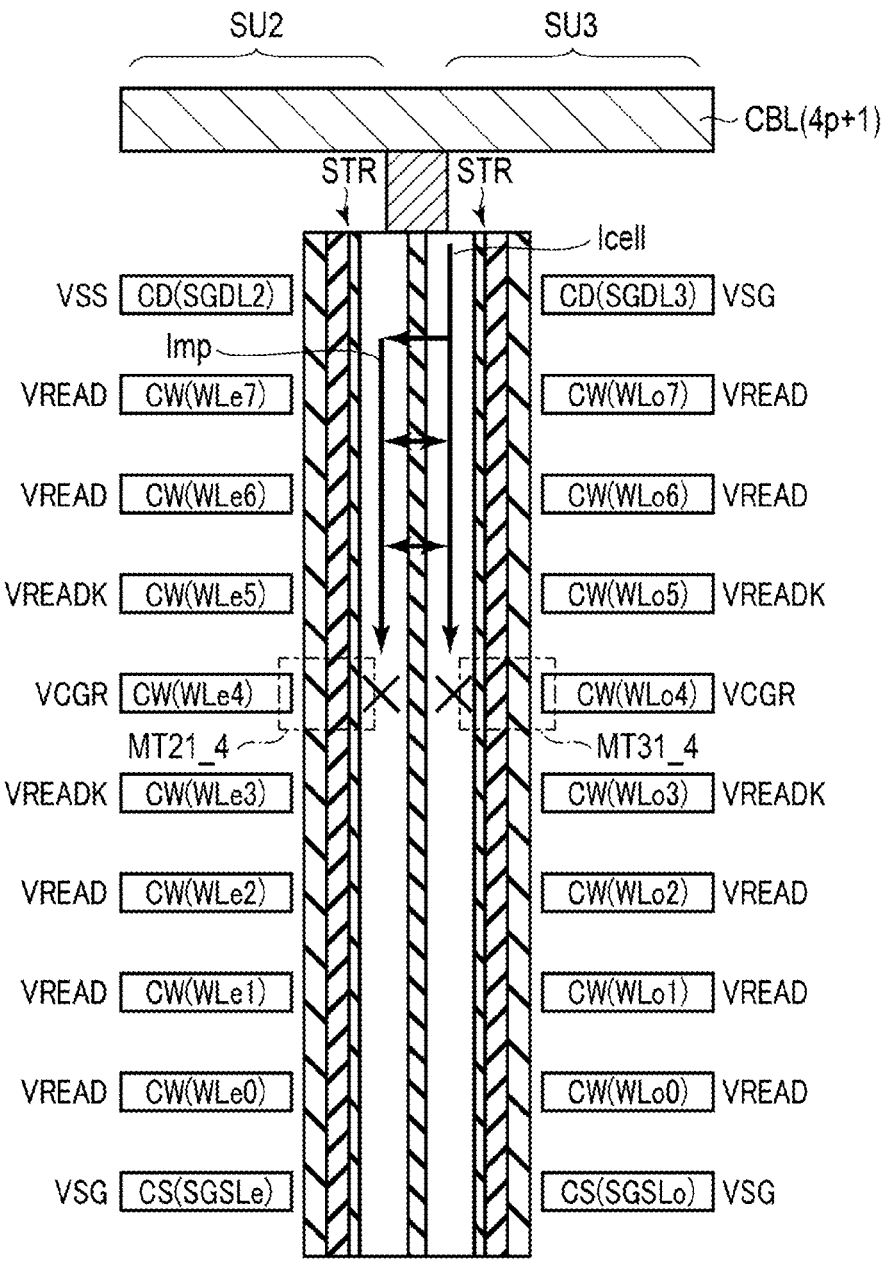
FIG. 28 illustrates another state of the part of the semiconductor memory of the fifth embodiment during the operation.

FIGS. 27 and 28 illustrate a state of a part of the semiconductor memory 1 in a certain operation, in the fifth embodiment. FIGS. 27 and 28 illustrate states of two strings STR which include two cell transistors MT (located on the back surface of each other) and are connected to the conductor CBL(4p+1) in the string units SU2 and SU3, in a period from the time point t2 to the time point t3 in FIG. 26.

As illustrated in FIGS. 27 and 28, in the string STR of the string unit SU3, a cell current Icell flows (case in FIG. 27) or does not flow (case in FIG. 28) through the cell transistor MT31_4 based on the threshold voltage of the cell transistor MT31_4. The cell transistor MT21_4 in the string STR of the string unit SU2 is in a state of having a high threshold voltage, such as the Pr state. Thus, even though the read voltage VCGR is received, the cell transistor MT21_4 does not turn ON. Thus, the current Imp does not flow through the cell transistor MT21_4. Therefore, the occurrence of a situation in which flowing of the current Imp in the cell transistor MT21_4 influences the determination of the state of the cell transistor MT31_4 is suppressed.

The states of the strings STR connected to the conductor CBL(4p+1) in the selected string units SU4 and SU5 are similar to those in FIGS. 27 and 28. Specifically, the symbols of "SU2", "SU3", "SGDL2", and "SGDL3" in FIGS. 27 and 28 may be replaced with "SU5", "SU4", "SGDL5", and "SGDL4", respectively.

According to the fifth embodiment, the backside cell transistor MT of the backside cell transistor MT that stores data in the power-on-read area 41 is not used for storing data and is in the Pr state, for example. Therefore, the circuit for generating the negative voltage is not required, similar to the first embodiment. In addition, it is possible to suppress the occurrence of interference by the backside cell transistor MT with determination of data (state) of the read target cell transistor MT.

Further, according to the fifth embodiment, similar to the third embodiment, the same data is stored in two cell units CU in the power-on-read area 41, and data is read from the two cell units CU. Therefore, the same advantages as those in the third embodiment are obtained.

Sixth Embodiment

A sixth embodiment has a form in which multiple selection is applied to the second embodiment in a manner different from that in the fourth embodiment.

FIG. 29 illustrates storage of data by some cell transistors MT located in the same layer in the power-on-read area 41 in a semiconductor memory 1 according to the second embodiment. As illustrated in FIG. 29, similar to the fifth embodiment, two string units SU having addresses adjacent to each other in the power-on-read area 41, for example, the string units SU3 and SU4 are multiple-selected. Thus, the string units SU3 and SU4 store the same data.

In addition, similar to the second embodiment, the backside cell transistor MT of each read target cell transistor MT among the cell transistors MT in the string units SU3 and SU4 are in the same state as that of the read target cell transistor MT.

A cell transistor MT which is not located on the back surface of the cell transistor MT in the string unit SU3 or SU4 among the cell transistors MT in the string units SU2 and SU5 can be used for storing data, that is, can be in the state in accordance with data. Specifically, the cell transistor MT connected to the conductor CBL(4p+2), CBL(4p+3), or CBL(4p+4) among the cell transistors MT of the string unit SU2 and SU5 can be used for storing data.

Figure 30:
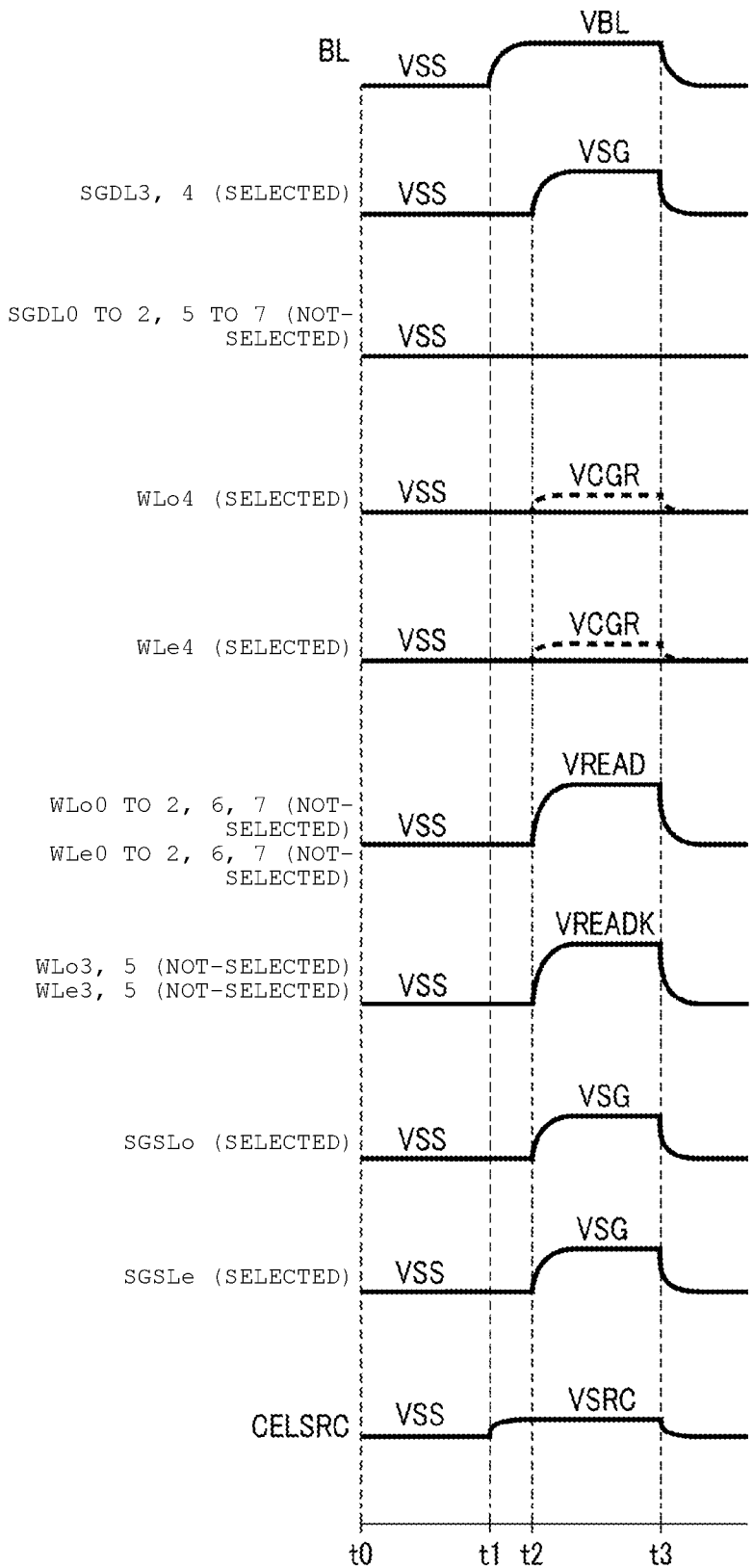
FIG. 30 is a timing diagram of voltages applied to various elements during an operation of the semiconductor memory of the sixth embodiment.

FIG. 30 is a timing diagram of voltages applied to various elements during an operation of the semiconductor memory 1 of the sixth embodiment. More specifically, FIG. 30 illustrates an operation on a selected block BLK in the power-on-read area 41. FIG. 30 illustrates voltages applied to various elements in reading from the cell unit CU connected to the word line WLo4 in a state where the string units SU3 and SU4 in the selected block BLK are multiple-selected, over time, as an example. Descriptions will be made below focusing on points different from those in the second embodiment (FIG. 17).

As illustrated in FIG. 30, the voltage VSG is applied to the select gate lines SGDL3 and SGDL4 for the string units SU3 and SU4 which are multiple-selected, during a period from a time point t2 to a time point t3. The voltage VSG is applied to the select gate lines SGSLo and SGSLe during a period from a time point t2 to a time point t3. With such an application of the voltage, the string STR in the string unit SU3 and the string STR in the string unit SU4 are electrically connected to each other between the bit line BL and the cell source line CELSRC.

The read voltage VCGR is applied to the word lines WLo4 and WLe4 during a period of time points t2 to t3. With such an application of the voltage, it is determined whether or not the cell current Icell flows in the cell transistors MT31_4 and MT41_4, based on data in the cell transistors MT31_4 and MT41_4. Thus, it is possible to determine the states of the cell transistors MT31_4 and MT41_4.

The states of the strings STR connected to the conductor CBL(4p+1) in the selected string units SU3 and SU2 are identical to those in the second embodiment (FIGS. 18 and 19).

The states of the strings STR connected to the conductor CBL(4p+1) in the selected string units SU4 and SU5 are identical to those in the second embodiment (FIGS. 18 and 19). Specifically, the symbols of "SU2", "SU3", "SGDL2", and "SGDL3" in FIGS. 18 and 19 and the related descriptions may be replaced with "SU5", "SU4", "SGDL5", and "SGDL4", respectively.

According to the sixth embodiment, similar to the second embodiment, the backside cell transistor MT of the read target cell transistor MT that stores data in the power-on-read area 41 stores the same data as that in the read target cell transistor MT, and is in a state of having been selected during a period of reading from the read target cell transistor MT. Therefore, the same advantages as those in the second embodiment are obtained.

Further, according to the sixth embodiment, similar to the third embodiment, the same data is stored in two cell units CU in the power-on-read area 41, and data is read from the two cell units CU. Therefore, the same advantages as those in the third embodiment are obtained.

Seventh Embodiment

A seventh embodiment has a form in which multiple selection is applied to the first embodiment in a manner different from those in the fourth and sixth embodiments.

FIG. 31 illustrates storage of data by some cell transistors MT located in the same layer in the power-on-read area 41 in a semiconductor memory 1 according to the seventh embodiment. As illustrated in FIG. 31, three string units SU having the consecutive addresses, for example, the string units SU2, SU3, and SU4 are multiple-selected. Thus, the string units SU2, SU3, and SU4 store the same data. Specifically, three cell transistors MT connected to the same bit line BL, in the string units SU2, SU3, and SU4, are in the same state.

All cell transistors MT in the string unit SU3 are located on the back surface of any cell transistor MT in the string unit SU2 or SU4. Some cell transistors MT in the string units SU2 and SU5 are not located on the back surface of the cell transistor MT of the string unit SU4 and but located on the back surface of the cell transistor MT in the string unit SU1. Therefore, similar to the second embodiment, the backside cell transistor MT of the read target cell transistor MT in the string unit SU2 or SU4, among the cell transistors MT in the string units SU1 and SU5, is in the same state as that of the read target cell transistor MT. Specifically, the cell transistor MT connected to the conductor CBL(4p+2), CBL(4p+3), or CBL(4p+4) among the cell transistors MT of the string unit SU1 is in the same state as that of the corresponding backside cell transistor MT. The cell transistor MT connected to the conductor CBL(4p+1) among the cell transistors MT in the string unit SU5 is in the same state as that of the corresponding backside cell transistor MT.

The cell transistor MT which is not located on the back surface of the cell transistor MT in the string unit SU2 or SU4 among the cell transistors MT in the string units SU1 and SU5 can be used for storing data, that is, can be in the state in accordance with data. Specifically, the cell transistor MT connected to the conductor CBL(4p+1) among the cell transistors MT of the string unit SU1 and the cell transistor MT connected to the conductor CBL(4p+2), CBL(4p+3), or CBL(4p+4) among the cell transistors MT of the string unit SU5 can be used for storing data.

Figure 32:
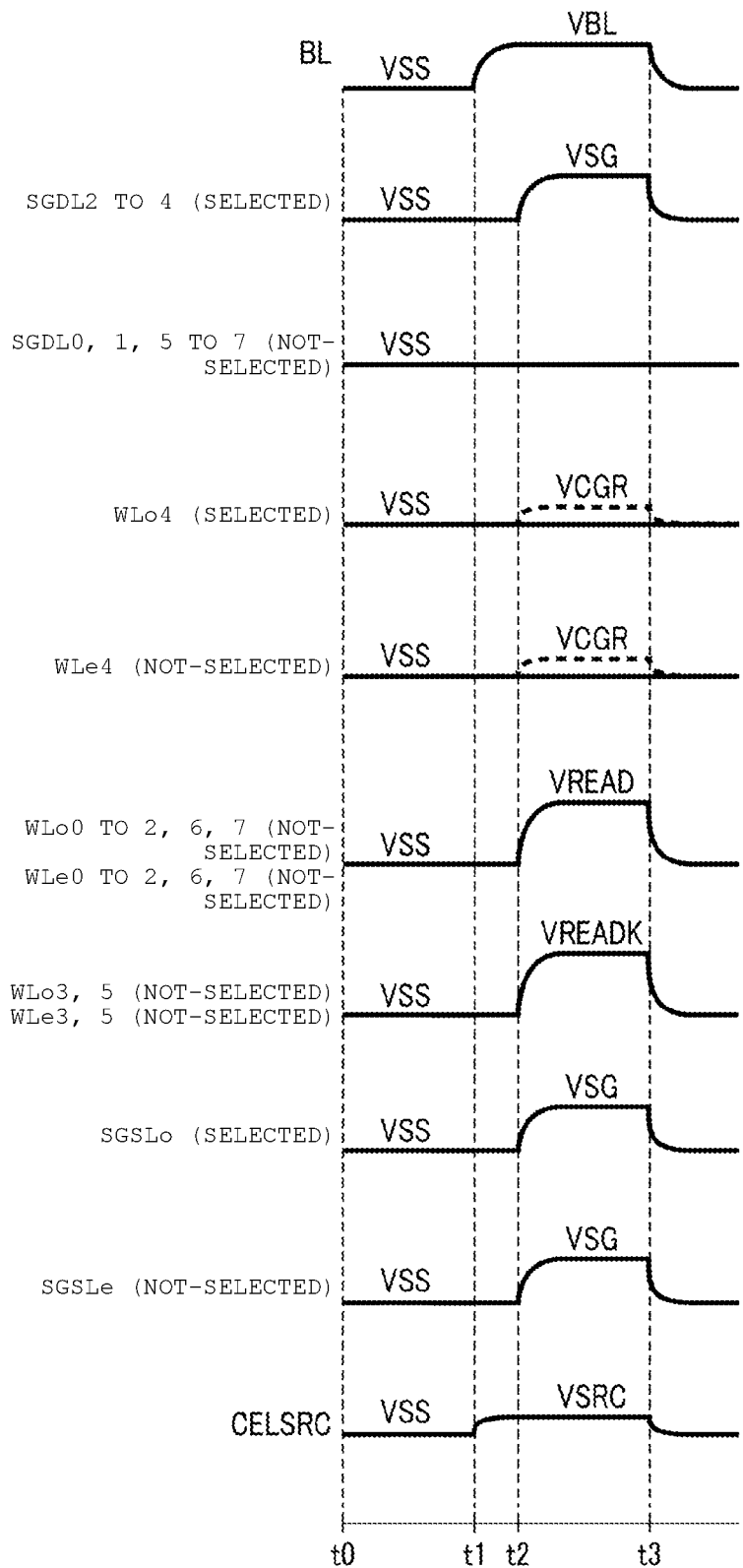
FIG. 32 is a timing diagram of voltages applied to various elements during an operation of the semiconductor memory of the seventh embodiment.

FIG. 32 is a timing diagram of voltages applied to various elements during an operation of the semiconductor memory 1 of the seventh embodiment. More specifically, FIG. 32 illustrates an operation on a selected block BLK in the power-on-read area 41. FIG. 32 illustrates voltages applied to various elements in reading from the cell unit CU connected to the word line WLo4 in a state where the string units SU2, SU3, and SU4 in the selected block BLK are multiple-selected, over time, as an example. Descriptions will be made below focusing on points different from those in the second embodiment (FIG. 17).

As illustrated in FIG. 32, the voltage VSG is applied to the select gate lines SGDL2, SGDL3, and SGDL4 for the string units SU2, SU3, and SU4 which are multiple-selected, during a period from a time point t2 to a time point t3. The voltage VSG is applied to the select gate lines SGSLo and SGSLe during a period from a time point t2 to a time point t3. With such an application of the voltage, the string STR in the string unit SU2, the string STR in the string unit SU3, and the string STR in the string unit SU4 are electrically connected to each other between the bit line BL and the cell source line CELSRC.

The read voltage VCGR is applied to the word line WLo4 and the word line WLe4 during a period from the time point t2 to the time point t3. With such an application of the voltage, it is determined whether or not the cell current Icell flows in the cell transistors MT21_4, MT31_4, and MT41_4, based on data in the cell transistors MT21_4, MT31_4, and MT41_4. Thus, it is possible to determine the states of the cell transistors MT21_4, MT31_4, and MT41_4.

Figure 33:
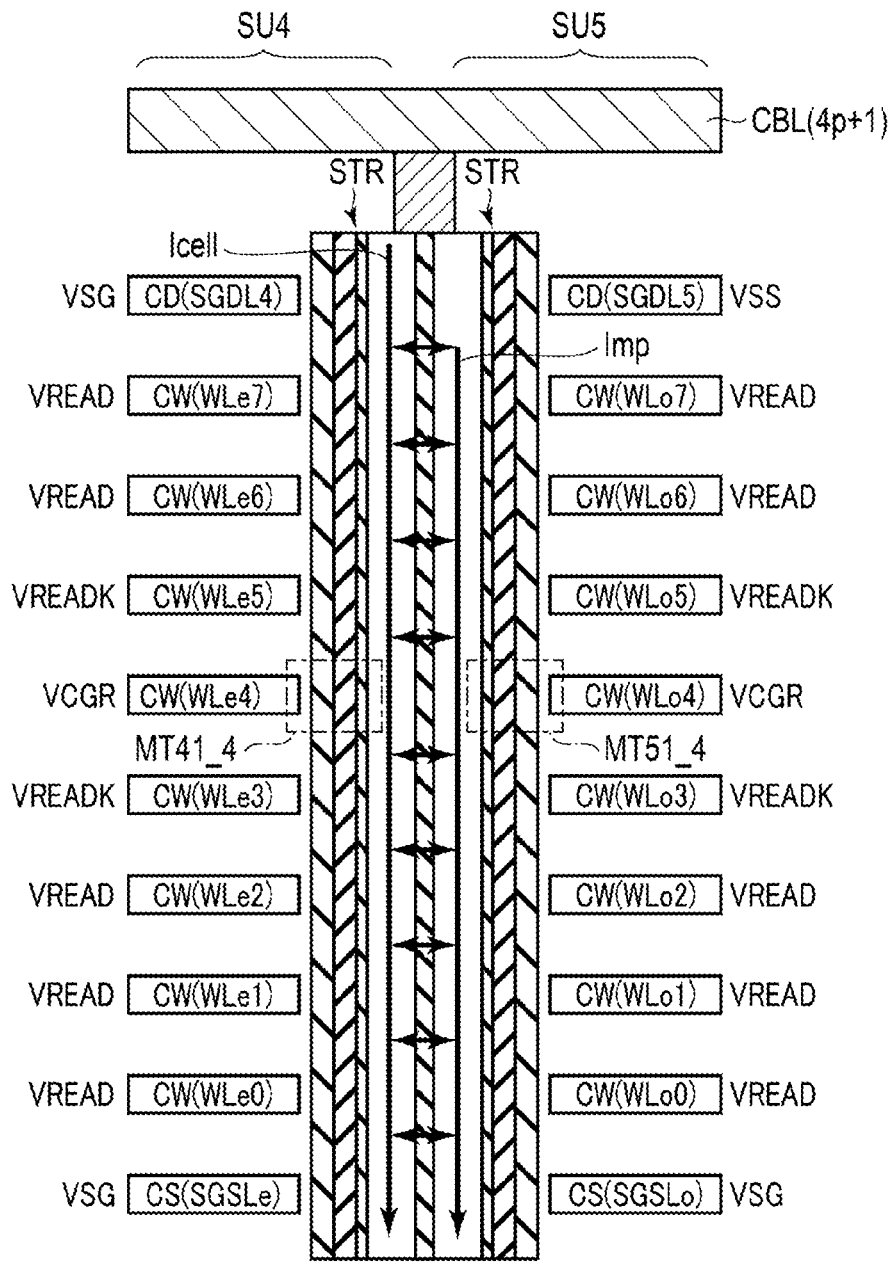
FIG. 33 illustrates a state of a part of the semiconductor memory of the seventh embodiment during an operation.
Figure 34:
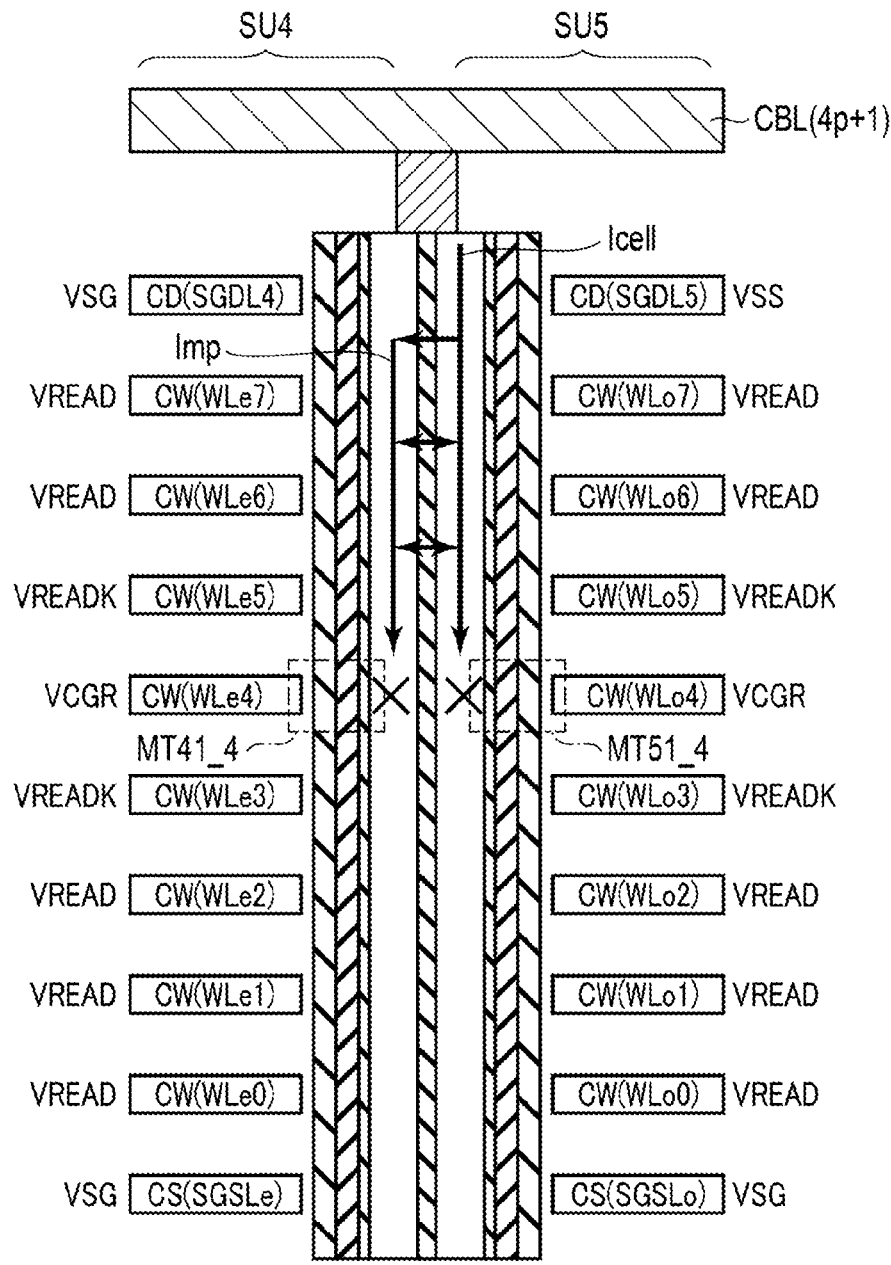
FIG. 34 illustrates another state of the part of the semiconductor memory of the seventh embodiment during the operation.

FIGS. 33 and 34 illustrate a state of a part of the semiconductor memory 1 in a certain operation, in the seventh embodiment. FIGS. 33 and 34 illustrate states of two strings STR which include two cell transistors MT (located on the back surface of each other) in the string units SU4 and SU5 and are connected to the conductor CBL1, in a period from the time point t2 to the time point t3 in FIG. 32. FIG. 33 illustrates a case where the cell transistor MT41_4 in the string unit SU4 has a threshold voltage which is equal to or lower than the read voltage VCGR. FIG. 34 illustrates a case where the cell transistor MT41_4 has a threshold voltage which is higher than the read voltage VCGR.

As illustrated in FIGS. 33 and 34, in the string STR of the string unit SU4, a cell current Icell flows (case in FIG. 33) or does not flow (case in FIG. 34) based on the threshold voltage of the cell transistor MT41_4. At this time, in the string unit SU5, the cell transistor MT51_4 stores the same data as that in the cell transistor MT41_4, and the read voltage VCGR is applied to the word line WLo4 along with the word line WLe4. Therefore, as illustrated in FIG. 33, if the cell transistor MT41_4 turns ON by applying the read voltage VCGR, the cell transistor MT51_4 also turns ON, and thus a current Imp flows in the cell transistor MT51_4. As illustrated in FIG. 34, if the cell transistor MT41_4 maintains the OFF state even though the read voltage VCGR is applied, the cell transistor MT51_4 also maintains the OFF state. Thus, the occurrence of a situation in which the state of the cell transistor MT51_4 influences the cell current Icell is avoided. In addition, the cell transistor MT51_4 assists the cell current Icell, that is, amplifies a difference of the value of the cell current Icell between a case where the cell current Icell does not flow (the cell current Icell is zero) and a case where the cell current Icell flows.

The states of the read target cell transistor MT41_4 and the cell transistor MT51_4 have been described with reference to FIGS. 33 and 34. The descriptions for such states are similarly applied to the states of the read target cell transistors MT22, MT23, and MT24 in the string unit SU2 and the states of the cell transistors MT12, MT13, and MT14 in the string unit SU1. The symbols of "SU4", "SU5", "SGDL4", "SGDL5", "MT41_4", and "MT51_4" in FIGS. 33 and 34 may be replaced with "SU2", "SU1", "SGDL2", "SGDL1", "MT22_4", and "MT12_4", respectively. The symbols of "SU4", "SU5", "SGDL4", "SGDL5", "MT41_4", and "MT51_4" in FIGS. 33 and 34 may be replaced with "SU2", "SU1", "SGDL2", "SGDL1", "MT23_4", and "MT13_4", respectively. The symbols of "SU4", "SU5", "SGDL4", "SGDL5", "MT41_4", and "MT51_4" in FIGS. 33 and 34 may be replaced with "SU2", "SU1", "SGDL2", "SGDL1", "MT24_4", and "MT14_4", respectively.

The multiple selection for the three string units SU in the seventh embodiment may be applied to the fifth embodiment. In this case, the cell transistor MT located on the back surface of the cell transistor MT in the string unit SU2 or SU4, among the cell transistors MT in the string units SU1 and SU5, is in the Pr state.

The multiple selection for the three string units SU in the seventh embodiment may be applied to the third embodiment. That is, the string units SU having addresses of odd numbers, for example, the string units SU1, SU3, and SU5 are multiple-selected. In this case, the cell transistor MT located on the back surface of the cell transistor MT in the string unit SU1 or SU5, among the cell transistors MT in the string units SU0 and SU6, is in the Pr state.

The multiple selection for the three string units SU in the seventh embodiment may be applied to the fourth embodiment. That is, the string units SU having addresses of odd numbers, for example, the string units SU1, SU3, and SU5 are multiple-selected. In this case, the cell transistor MT located on the back surface of the read target cell transistor MT in the string unit SU1 or SU5, among the cell transistors MT in the string units SU0 and SU6, is in the same state as that of the read target cell transistor MT.

Modification Examples

Hitherto, the examples in which the embodiments are made based on the structure in FIGS. 5 to 8 are described. However, the embodiment may be applied to structures. FIGS. 35 to 38 illustrate structures to which the embodiments can be applied.

Figure 35:
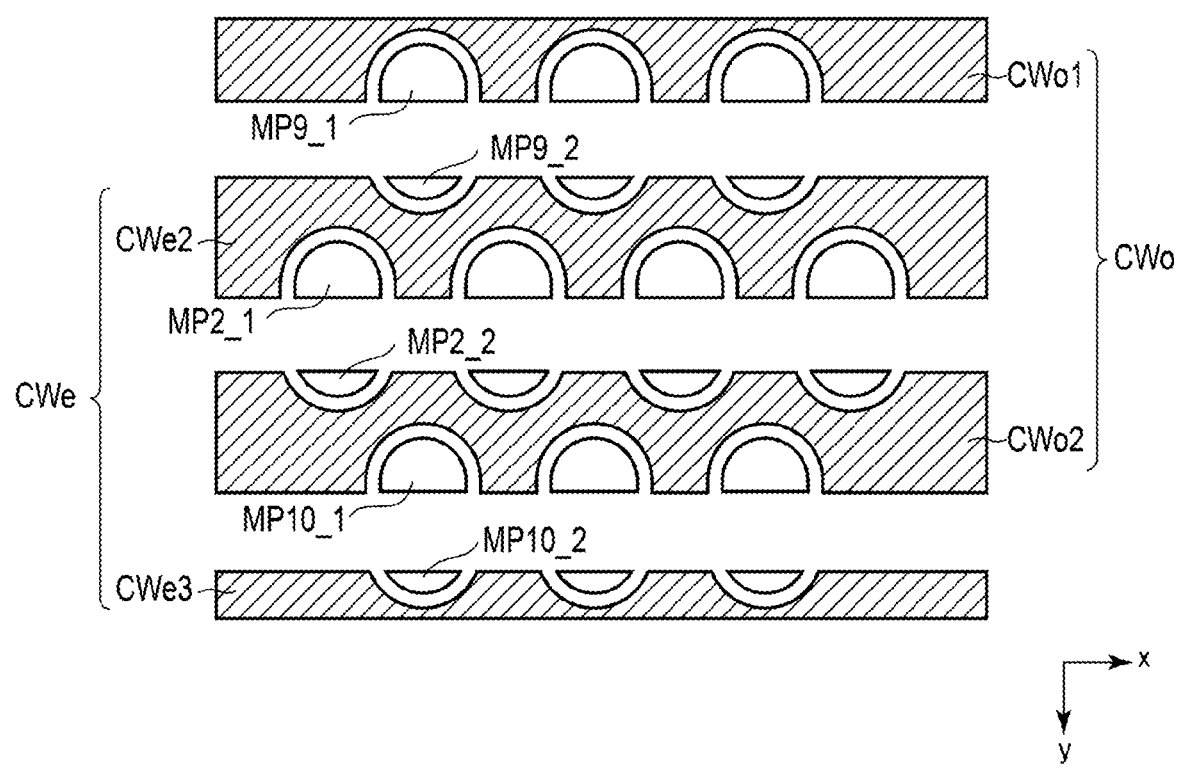
FIG. 35 is a plan view of a part of a semiconductor memory according to a first modification of the embodiments.

FIG. 35 is a plan view of a part of a semiconductor memory 1 according to a first modification the embodiments. FIG. 35 illustrates a layer of a certain conductor CW. A layer of another conductor CW has the same structure.

As illustrated in FIG. 35, each memory pillar MP is divided into two memory pillars MP_1 and MP_2. The boundary between the memory pillars MP_1 and MP_2 coincides with the boundary between a portion of the conductor CWo and a portion of the conductor CWe aligned with the portion of the conductor CWo, for example, between the part CWo1 and the part CWe2.

Figure 36:
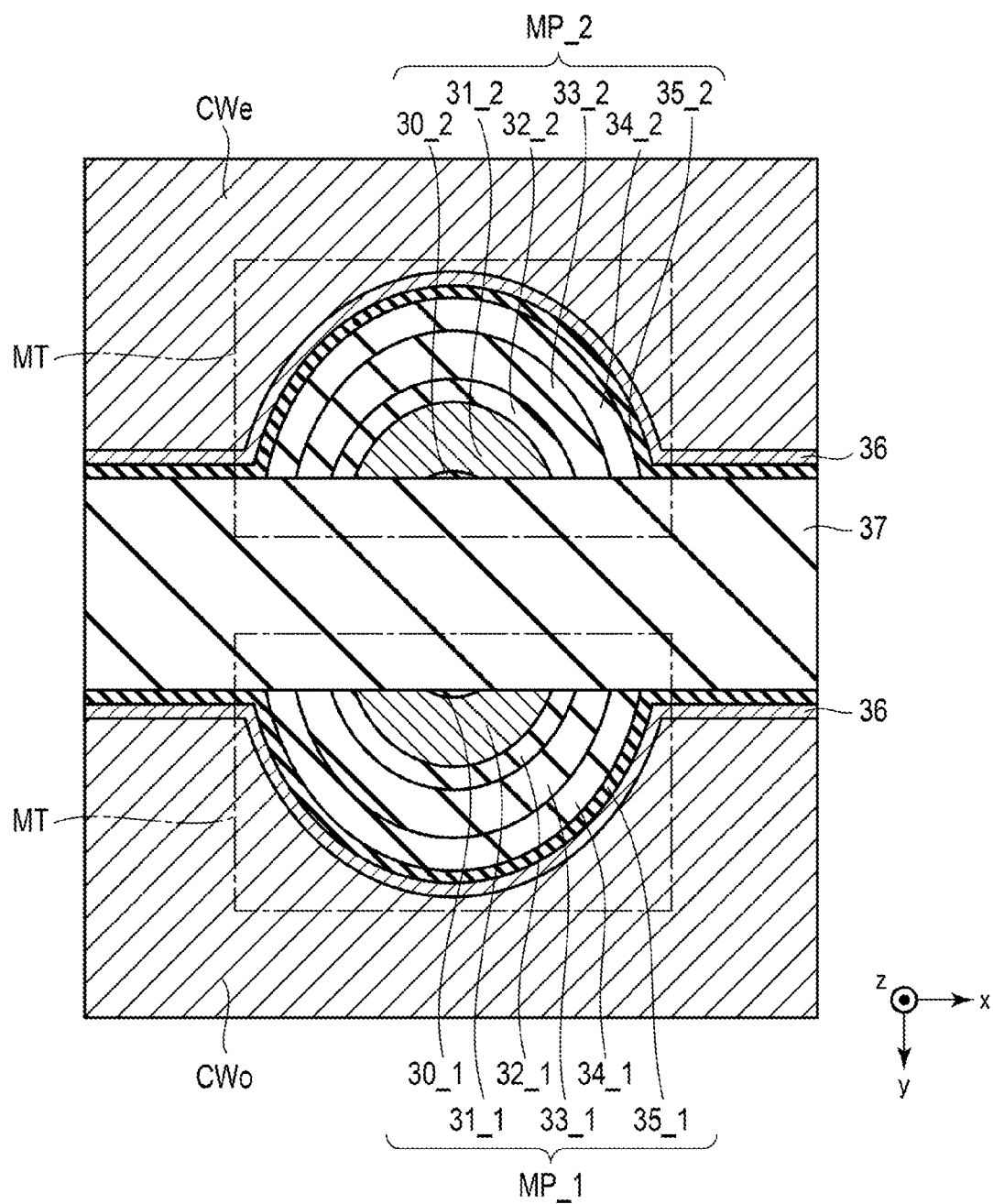
FIG. 36 illustrates a part of the semiconductor memory according to the first modification of the embodiments.

FIG. 36 illustrates a portion of the semiconductor memory 1 according to the first modification of the embodiments. FIG. 36 illustrates a cross-section of memory pillar MP taken along the xy plane. As illustrated in FIG. 36 and described above, one memory pillar MP is divided into two memory pillars MP_1 and MP_2. Thus, each of the insulator 30, the semiconductor 31, the insulator 32, the insulator 33, and the insulator 34 is also divided into two pieces, as described below.

The insulator 30 in the first structure is divided into insulators 30_1 and 30_2. The semiconductor 31 in the first structure is divided into a semiconductor 31_1 and a semiconductor 31_2. The insulator 32 in the first structure is divided into insulators 32_1 and 32_2. The insulator 33 in the first structure is divided into insulators 33_1 and 33_2. The insulator 34 in the first structure is divided into insulators 34_1 and 34_2.

The memory pillar MP_1 includes the insulator 30_1, the semiconductor 31_1, the insulator 32_1, the insulator 33_1, and the insulator 34_1. The memory pillar MP_2 includes the insulator 30_2, the semiconductor 31_2, the insulator 32_2, the insulator 33_2, and the insulator 34_2.

Figure 37:
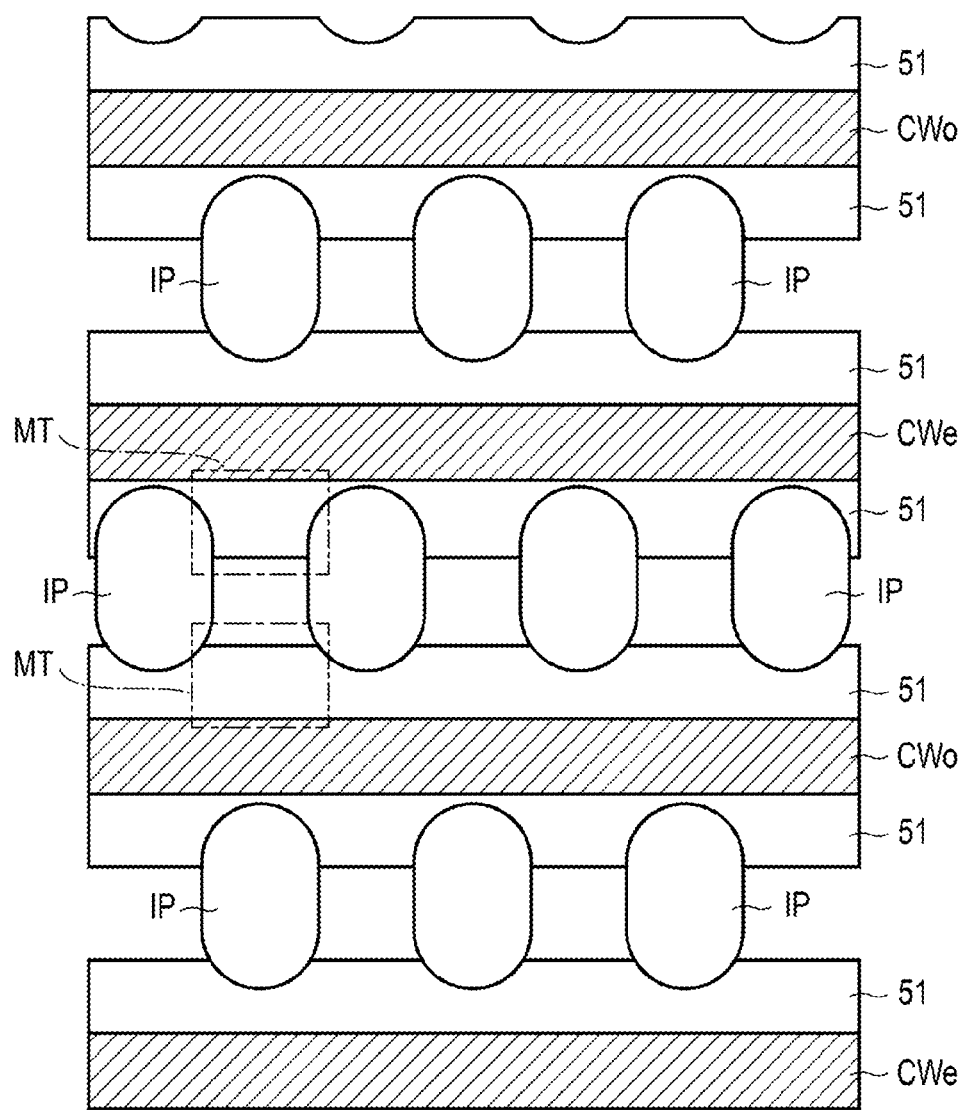
FIG. 37 is a plan view of a part of the semiconductor memory according to a second modification of the embodiments.

FIG. 37 is a plan view of a part of the semiconductor memory 1 according to a second modification of the embodiments, similar to the structure illustrated in FIG. 7. FIG. 37 illustrates a layer of a certain conductor CW. A layer of another conductor CW has the same structure.

As illustrated in FIG. 37, the conductor CWo (part of the conductor CWo) and the conductor CWe (part of the conductor CWe) extend along the x-axis. The conductors CWo and CWe are alternately arranged along the y-axis. Two conductors CWo that sandwich one conductor CWe are connected to each other in an area which is not illustrated in FIG. 37, similar to the first embodiment (FIG. 6). Two conductors CWe that sandwich one conductor CWo are connected to each other in an area which is not illustrated in FIG. 37, similar to the first embodiment. Stacked bodies 51 are provided on two side surfaces extending along the x-axis, in each of the conductors CWo and CWe. The stacked body 51 includes a conductor and an insulator which are provided to be arranged along the y-axis.

A plurality of isolation pillars IP are provided between two stacked bodies 51 which are arranged along the y-axis. Similar to the memory pillar MP, the isolation pillar IP extends along the z-axis. However, the isolation pillar IP is made of an insulator, differing from the memory pillar MP. Each isolation pillar IP partially overlaps the two stacked bodies 51 which are arranged along the y-axis, and thus isolates a part of the stacked body 51 on the right and left sides of the isolation pillar IP. One cell transistor MT is configured from a part of each stacked body 51, between two isolation pillars IP adjacent to each other.

Figure 38:
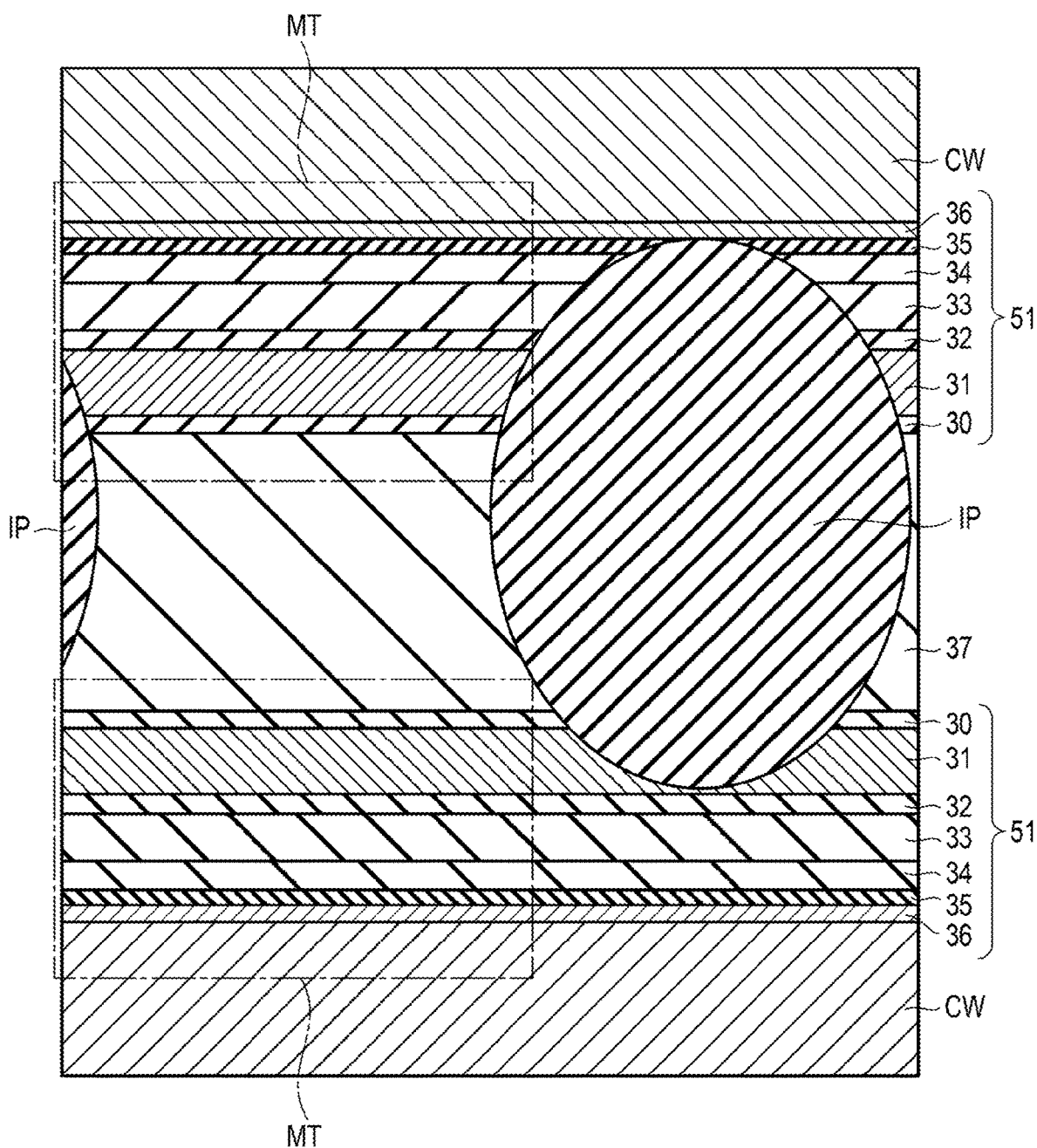
FIG. 38 illustrates another part of the semiconductor memory according to the second modification of the embodiments.

FIG. 38 illustrates another part of the semiconductor memory 1 according to the second modification of the embodiments. FIG. 38 illustrates a structure of a section obtained by taking the isolation pillar IP along the xy plane. As illustrated in FIG. 38, the conductor 36 is provided on an xz plane of each conductor CW. The insulator 35 is provided on the xz plane of the conductor 36. The insulator 34 is provided on the xz plane of the insulator 35. The insulator 33 is provided on the xz plane of the insulator 34. The insulator 32 is provided on the xz plane of the insulator 33. The semiconductor 31 is provided on the xz plane of the insulator 32. The insulator 30 is provided on the xz plane of the semiconductor 31. The insulator 37 is provided between the two insulators 30 arranged along the y-axis.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without depart-

What is claimed is:

1. A semiconductor storage device comprising:
a plurality of semiconductor pillars each extending above a substrate;
a first bit line electrically connected to a first semiconductor pillar of the plurality of semiconductor pillars;
a second bit line electrically connected to a second semiconductor pillar of the plurality of semiconductor pillars;
a third bit line electrically connected to a third semiconductor pillar of the plurality of semiconductor pillars;
a first word line at a first level above the substrate;
a second word line at the first level above the substrate and electrically isolated from the first word line;
a first cell transistor including a first part of the first semiconductor pillar that faces the first word line;
a second cell transistor including a second part of the first semiconductor pillar that faces the second word line;
a third cell transistor including a first part of the second semiconductor pillar that faces the first word line;
a fourth cell transistor including a second part of the second semiconductor pillar that faces the second word line;
a fifth cell transistor including a first part of the third semiconductor pillar that faces the first word line;
a sixth cell transistor including a second part of the third semiconductor pillar that faces the second word line;
a first select transistor between the first bit line and the first cell transistor;
a second select transistor between the first bit line and the second cell transistor;
a third select transistor between the second bit line and the third cell transistor;
a fourth select transistor between the second bit line and the fourth cell transistor;
a fifth select transistor between the third bit line and the fifth cell transistor;
a sixth select transistor between the third bit line and the sixth cell transistor, wherein
the first, third, and fifth select transistors are commonly controlled to be ON or OFF, and the second, fourth and sixth select transistors are commonly controlled to be ON or OFF, and
during a reading operation to read data from the first cell transistor, the first, third, and fifth select transistors are controlled to be ON, and the second, fourth, and sixth select transistors are controlled to be OFF, and a first voltage that is greater than or equal to zero voltage and less than a threshold voltage of the second cell transistor is applied to the second word line.

2. The semiconductor storage device according to claim 1, wherein
the first and second parts of each of the first, second, and third semiconductor pillars are on opposite sides of the respective first, second, and third semiconductor pillars, and
the third semiconductor pillar is between the first and second semiconductor pillars in a direction along which the first, second, and third bit lines extend.

3. The semiconductor storage device according to claim 2, wherein the first and second word lines are comb-shaped and are positioned with respect to each other so that teeth portions of the first word line are interleaved with teeth portions of the second word line.

4. The semiconductor storage device according to claim 3, wherein the first, second, and third bit lines each extend in a first direction parallel to a surface of the substrate and the teeth portions of the first and second word lines each extend in a second direction that is parallel to the surface of the substrate and crosses the first direction.

5. The semiconductor storage device according to claim 4, wherein the semiconductor pillars are arranged between one of the teeth portions of the first word line and one of the teeth portions of the second word line.

6. The semiconductor storage device according to claim 5, wherein the first and second semiconductor pillars are aligned along the first direction and the third semiconductor pillar is offset in the second direction from the first and second semiconductor pillars.

7. The semiconductor storage device according to claim 6, wherein the first and second bit lines are each directly above the first and second semiconductor pillars but not directly above the third semiconductor pillar, and the third bit line is directly above the third semiconductor pillar but not directly above the first and second semiconductor pillars.

8. The semiconductor storage device according to claim 1, wherein the first and second select transistors include parts of the first semiconductor pillar, the third and fourth select transistors include parts of the second semiconductor pillar, and the fifth and sixth select transistors include parts of the third semiconductor pillar.

9. A semiconductor storage device comprising:
first, second, and third semiconductor pillars each extending above a substrate, wherein the third semiconductor pillar is between the first and second semiconductor pillars along a first direction;
a first bit line electrically connected to the first semiconductor pillar and extending in the first direction;
a second bit line electrically connected to the second semiconductor pillar and extending in the first direction;
a third bit line electrically connected to the third semiconductor pillar and extending in the first direction;
a first word line at a first level above the substrate;
a second word line at the first level above the substrate and electrically isolated from the first word line;
a first cell transistor including a first part of the first semiconductor pillar that faces the first word line;
a second cell transistor including a second part of the first semiconductor pillar that faces the second word line;
a third cell transistor including a first part of the second semiconductor pillar that faces the first word line;
a fourth cell transistor including a second part of the second semiconductor pillar that faces the second word line;
a fifth cell transistor including a first part of the third semiconductor pillar that faces the first word line;
a sixth cell transistor including a second part of the third semiconductor pillar that faces the second word line;
a first select transistor between the first bit line and the first cell transistor;
a second select transistor between the first bit line and the second cell transistor;
a third select transistor between the second bit line and the third cell transistor;
a fourth select transistor between the second bit line and the fourth cell transistor;
a fifth select transistor between the third bit line and the fifth cell transistor;

a sixth select transistor between the third bit line and the sixth cell transistor, wherein the first, third, and fifth select transistors are commonly controlled to be ON or OFF, and the second, fourth and sixth select transistors are commonly controlled to be ON or OFF, and during a reading operation to read data from the first cell transistor, the first, third, and fifth select transistors are controlled to be ON, and the second, fourth, and sixth select transistors are controlled to be OFF, and a first voltage that is greater than or equal to zero voltage and less than a threshold voltage of the second cell transistor is applied to the second word line.

10. The semiconductor storage device according to claim 9, wherein the first and second select transistors include parts of the first semiconductor pillar, the third and fourth select transistors include parts of the second semiconductor pillar, and the fifth and sixth select transistors include parts of the third semiconductor pillar.

11. The semiconductor storage device according to claim 10, wherein the first and second word lines are comb-shaped and are positioned with respect to each other so that teeth portions of the first word line are interleaved with teeth portions of the second word line, and the teeth portions of the first and second word lines each extend in a second direction that is parallel to the surface of the substrate and crosses the first direction.

12. The semiconductor storage device according to claim 11, wherein the semiconductor pillars are arranged between one of the teeth portions of the first word line and one of the teeth portions of the second word line.

13. The semiconductor storage device according to claim 9, wherein the third semiconductor pillar is not aligned with first and second semiconductor pillars along the first direction.

14. The semiconductor storage device according to claim 13, wherein the first and second bit lines are each directly above the first and second semiconductor pillars but not directly above the third semiconductor pillar, and the third bit line is directly above the third semiconductor pillar but not directly above the first and second semiconductor pillars.

* * * * *